(12) United States Patent
Argitis et al.

(10) Patent No.: US 8,247,158 B2
(45) Date of Patent: Aug. 21, 2012

(54) MOLECULAR RESISTS BASED ON FUNCTIONALIZED POLYCARBOCYCLES

(76) Inventors: Panagiotis Argitis, Paraskevi Attikis (GR); Evangelos Gogolides, Paraskevi Attikis (GR); Elias Couladouros, Psychico Attikis (GR); Dimitra Niakoula, Paraskevi Attikis (GR); Veroniki Vidali, Paraskevi Attikis (GR); Daman R. Gautam, Paraskevi Attikis (GR)

( * ) Notice: Subject to any disclaimer, the term of this patent is extended or adjusted under 35 U.S.C. 154(b) by 741 days.

(21) Appl. No.: 12/066,995

(22) PCT Filed: Sep. 18, 2006

(86) PCT No.: PCT/GR2006/000050
§ 371 (c)(1),
(2), (4) Date: Aug. 11, 2008

(87) PCT Pub. No.: WO2007/031803
PCT Pub. Date: Mar. 22, 2007

(65) Prior Publication Data
US 2009/0220887 A1 Sep. 3, 2009

(30) Foreign Application Priority Data
Sep. 16, 2005 (GR) .............................. 20050100472

(51) Int. Cl.
*G03F 7/004* (2006.01)
*G03F 7/039* (2006.01)
*C07C 69/74* (2006.01)
(52) U.S. Cl. ..................... 430/270.1; 430/326; 430/908; 430/905; 560/80; 560/8; 560/56

(58) Field of Classification Search .................. None
See application file for complete search history.

(56) References Cited

U.S. PATENT DOCUMENTS
2005/0026068 A1 * 2/2005 Gogolides et al. ......... 430/270.1

FOREIGN PATENT DOCUMENTS
WO           03038523 A2    5/2003
WO    WO 03/038523 A2    5/2003

OTHER PUBLICATIONS

Gogolides et al ("Photoresist Etch Resistance Enhancement Using Novel Polycarbocyclic Derivatives as Additives", Journal of Vacuum Science and Technology, B (2003), vol. 21(1), p. 141-147).*
Kadota et al., "Creation of Low-Molecular-Weight Organic Resist for Nanometer Lithography" Proc SPIE, 4345:891, 2001.

(Continued)

*Primary Examiner* — Sin J. Lee
(74) *Attorney, Agent, or Firm* — Porzio, Bromberg & Newman, P.C.

(57) ABSTRACT

The present invention refers to new organic molecules, derived from the class of polycarbocycle derivatives, and their application as components of photoresists, and in particular as components of photoresist compositions where no polymer is comprised as one of the photoresists components. In these photoresist formulations the new molecule(s) is/are the main component(s) (i.e. percentage higher than 50% w/w).

16 Claims, 3 Drawing Sheets

Molecular formulae of representative polycarbocycle molecules.

OTHER PUBLICATIONS

Yoshiiwa et al., "Novel Class of Low Molecular-Weight Organic Resists for Nanometer Lithography" Appl Phys Lett 69(17):2605-07, 1996.

Kadota et al., "Amorphous Molecular Materials: Development of Novel Negative Electron-Beam Molecular Resists" Mat Sci Eng C 16:91-94, 2001.

Gogolides et al., "Photoresist Etch Resistance Enhancement Using Novel Polycarbocyclic Derivatives as Additives" J Vac Sci Technol B 21(1):141-147, 2003.

Kadota et al., "Novel Electron-Beam Molecular Resists with High Resolution and High Sensitivity for Nanometer Lithography" Chem Let 33(6):706-707, 2004.

Hirayama et al., "New Photoresist Based on Amorphous Low Molecular Weight Polyphenols" J. Photopolymer Sci Tech 17(3):435-440, 2004.

Kim et al., "Novel Molecular Resist Based on Derivative of Cholic Acid" Chem Let 10:1064-65, 2002.

* cited by examiner (a) 145 nm M17 based resist. Dose 45 µC/cm²     (a) 106 nm M17 based resist. Dose 50 µC/cm²

(a) 150 nm M18 based resist. Dose 200 µC/cm²     (b) 220 nm M18 based resist. Dose 150 µC/cm²

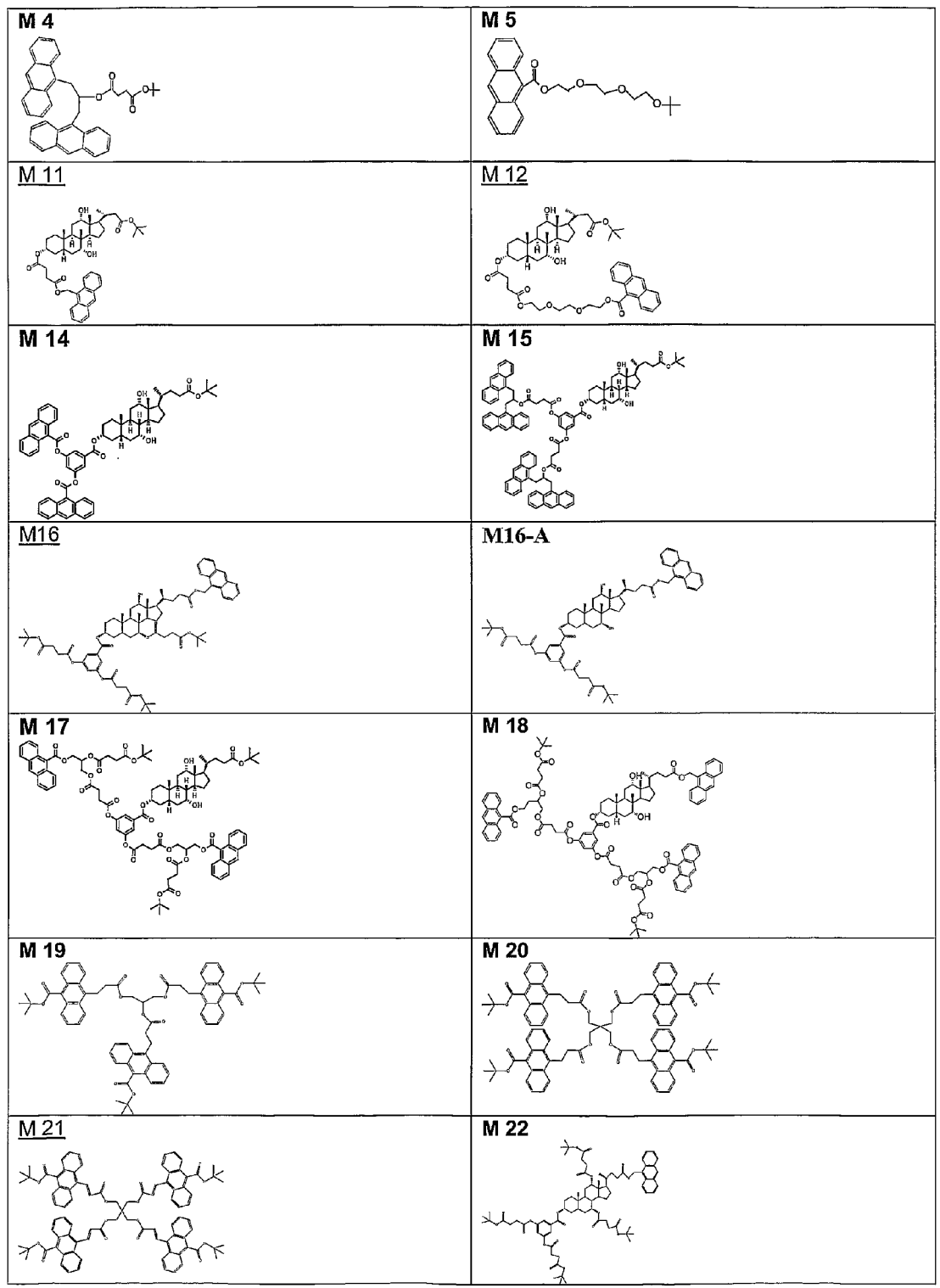
Figure 5. Molecular formulae of representative polycarbocycle molecules.

MOLECULAR RESISTS BASED ON FUNCTIONALIZED POLYCARBOCYCLES

The present invention refers to new organic molecules, derived from the class of polycarbocycle derivatives, and their application as components of photoresists, and in particular as components of different photoresist compositions where no polymer is comprised as one of the photoresists components. In these photoresist formulations the new molecule(s) is/are the main component(s) (i.e. percentage higher than 50% w/w).

STATE OF THE ART

Reliable fabrication of patterned micro-nanostructures represents one of the most essential steps that are encountered in a variety of applications in the broader field of Micro- and Nanotechnology. Although a number of novel routes have been proposed for the fabrication of patterned structures, standard resist-based optical lithography continues to be the predominant technology for the fabrication of electronic and optical devices. Indeed the resist technology has been greatly advanced during the last 30 years and allowed the decrease of the electronic device dimensions according to the well-known Moore law. The main direction followed during the last 20 years in lithography technology development was the reduction of exposure wavelength first from 436 nm to 365 nm and then to 248 nm and to 193 nm respectively. Each time a new exposure wavelength was considered for introduction in lithography new resists had to be developed with absorbance and photochemical properties suitable for exposure at this wavelength of choice. Currently, advanced 193 nm resists are available and allow the production of semiconductor devices with dimensions down to 90 nm.

Research efforts target today at the development of industrial nanofabrication processes, which could gradually reach 10 nm gate transistors or even below, which have nevertheless not been achieved yet in a way desirable by industry. This further progress can be accomplished only if photoresist materials suitable for the exposure wavelengths to be chosen are developed, which have also not been developed yet in a performance level desirable by industry. Indeed, during the last period the resist related issues have been well recognized to be among the most critical for the further improvement of the lithographic technologies at dimensions below 45 nm. It has been further recognized that the resist related technical challenges are to some extent independent on the specific exposure mode to be chosen since they are mostly related to fundamental material properties and reaction mechanisms, than to absorbance at the specific wavelength as has been so far. The very strict LER (line edge roughness) specifications for sub 45 nm (<2 nm, 3σ) seem the most difficult to meet while keeping at the same time the sensitivity at acceptable levels, e.g. dose<5 mJ/cm$^2$ for EUV exposure.

To meet specifications factors such as resist component size, resist dissolution properties, resist homogeneity and the control of diffusion and chemical reactions inside the resist film are considered of the highest priority.

The design of photoresist materials has been traditionally based on the use of polymers, mostly linear polymers, as main components of the photoresist formulation since these molecules provide good film formation properties, appropriate thermal properties and possibilities for solubility change with small extent chemical changes.

Nevertheless, the need for the design of ultra high resolution resists for e-beam and next generation lithography, ie resists targeting to sub 50 nm resolution and meeting strict line edge roughness specifications which have not yet been achieved today in a way desirable by industry, has led to the considerations that the resist component molecular dimensions can play a vital role on the quality of the patterns. Thus an increasing research effort has started lately on the use of small molecules as main components of resist formulations. Low MW polymers have been examined [1]. Alternatively, other types of organic molecules have been proposed as the main resist components [2-6] and were shown to be capable for the formation of uniform amorphous films by spin coating. Resist formulations based on the use of these molecules were shown to be further imaged following chemical routes similar to the ones used in traditional photoresists.

At this point it should be further noticed that the advanced resists used today are quite complicated multifunctional materials, where the linear polymers usually used as main components are copolymers of different monomers, each providing a certain functionality, like imaging capability, hydrophilicity, etch resistance etc. Additional resist components include usually the photosensitizer, a base component for acid diffusion control and possibly other additives for the improvement of certain properties.

It should be further noticed that in linear copolymers different functional groups often have the tendency to form aggregates or to orient towards the interfaces depending on the inter- (or intra-) molecular interactions in the resist film or the polymer-substrate interactions. For instance OH groups are expected to interact strongly with hydrophilic substrates whereas certain hydrophobic groups such as fluorine or siloxane groups have the tendency to orient themselves towards the air-film interface. The probability for preferential orientation of the different groups is very high in modern resist designs, because at least 3-5 groups are commonly present in each copolymer in order to offer the desired resist properties (such as etch resistance, imaging, adhesion to the substrate, thermal properties etc). Thus, thin resist films are expected to have different local concentrations of the various groups, depending on the distance from the substrate, which will result to strong development and etch resistance differentiation.

The present invention is referred to the use of molecules with different architecture than the typical linear copolymers as main components of resist formulations, which molecules, however, offer comparable to the linear polymers capabilities in resist material design, functionality incorporation and optimization. However, the molecules disclosed in the present invention are of much smaller size than typical linear copolymer molecules and of different molecular structure from all the other relevant molecules suggested in the state of the art.

SUMMARY OF THE INVENTION

In particular the present invention describes the use of functionalized polycarbocycles as main components of resists, continuing previous work of some of some of the inventors, where polycarbocyclic derivatives had been used as resist additives [7,8]. In relation to said work [7,8] the present invention now discloses new polycarbocyclic derivatives which may be the main components of a lithographic material, without the presence of polymers in the said lithographic material.

The molecules disclosed in the present invention provide an etch-resistant core to which the other desired functionalities are attached. This way these molecules provide materials with etch resistance comparable or better to the one exhibited by poly(hydroxy styrene) which is considered a standard material. In addition, the other necessary functional groups, e.g. hydrophilic groups like the hydroxyl groups and acid sensitive groups like the tert-butyl ester groups, can be incorporated following straightforward chemical routes. The molecular size can be at the order of 1.5 nm.

The above molecules if properly designed can be soluble in standard resist solvents and can give uniform films by spin coating with acceptable thermal properties ie glass transition temperature, decomposition temperature and sublimation temperature.

The above molecules can give chemically amplified resist formulations if combined with typical photoacid generators.

Further more, the resist formulations based on suitably designed functionalized polycarbocycles provide resist formulations that can be processed under conditions preferable by the semiconductor industry, including positive imaging under development with standard base developers.

In addition resist formulations based on suitably designed functionalized polycarbocycles have been already shown to be suitable for 100 nm imaging under e-beam and EUV exposure and higher resolution is expected with optimized formulations and optimized lithographic processing conditions.

DETAILED DESCRIPTION OF THE INVENTION

The invention provides molecular lithographic resists having as main component a molecule combining two characteristics:

1) the presence of at least two polycarbocyclic moieties per molecule, where at least one of them is an anthracene derivative and
2) the presence of at least one acid sensitive group per molecule.

The general formulae of these polycarbocycle containing molecules is the following:

$$R^1-\underset{\underset{R^2}{|}}{\overset{\overset{(A)m}{|}}{S}}-(B)n \quad\quad I$$

$$R^1-\underset{\underset{R^2}{|}}{\overset{\overset{X-(A)m}{|}}{S}}-X-(B)n \quad\quad II$$

In the above formulae I, II:

n or m is an integer of 1 to 4,

A represents an anthracene or adamantane or steroid moiety of the following structures:

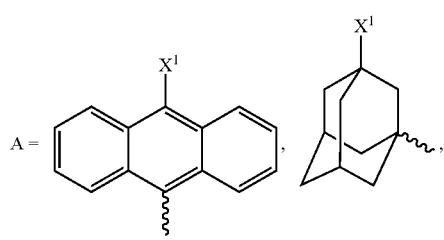

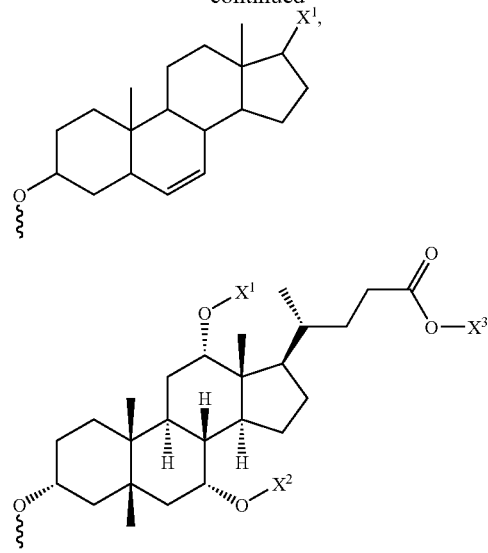

$X^1$ to $X^3$ may be as or different from one another and each thereof represents a hydrogen atom, or an alkyl group or a linker from the group of alkyl, or alkoxy-moieties or —COCH$_2$CH$_2$—, —COCH=CH— connected directly to an acid sensitive carboxylic acid ester, such as tert-butyl, tetrahydropyranyl, trialkyl-silyl, adamantyl etc.

$X^1$ to $X^3$ may also stand for an alkyl carboxylic acid ester with an additional moiety of the type A and they are not connected to each other by any chain.

X represents a linker from the group of —CH$_2$—, —O—, —COO—, —COCH$_2$—, —COOCH$_2$— or —CH$_2$CH$_2$COO—CH$_2$— or —CH=CH—COOCH$_2$— or —OCOCH$_2$CH$_2$—COOCH$_2$ or —OCO—CH=CH—COOCH$_2$— or —OCOCH$_2$CH$_2$— or —OCOCH=CH— or oxygenated aliphatic chain or carbocyclic aliphatic chain or carbocyclic polysubstituted aliphatic chain.

S represents a central aliphatic or cycloaliphatic or aromatic polyfunctionalized core of the following structures:

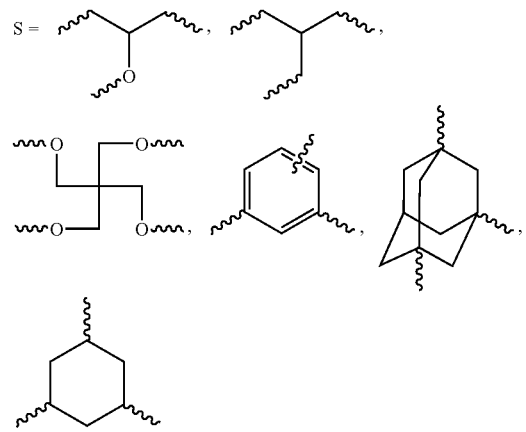

B may stand for a hydrogen atom or an alkyl group or an alkoxy group or an acid sensitive alkyl carboxylic acid ester, such as tert-butyl, tetrahydropyranyl, trialkyl-silyl, adamantyl etc. or an additional moiety of the type A represented above. If A is not an anthracene derivative in the formulae I, II, B is obligatory to be a moiety of the type A represented above containing at least one anthracene.

R[1], R[2] may be different from one another and they may stand for a hydrogen atom or an alkyl group or a linker of the type X connected to a moiety of the type B represented above.

In all the above descriptions, the alkyl group comprises for example methyl-, ethyl-, n-propyl-, isopropyl-, n-butyl-, isobutyl-, sec-butyl-, t-butyl-, n-pentyl-, n-hexyl-, n-octyl-, n-dodecyl-groups and the like. An alkoxy group comprises for example methoxy-, ethoxy-, propoxy-, butoxy-, methoxymethylenoxy-, methoxyethylenoxy-group and the like. It should be noticed that none of the linkers represents any kind of polymeric chain.

The invention provides novel resists containing at least two components, where the main component is a polycarbocycle-based properly functionalised organic molecule as described above and the second component is a photoacid generator. These resists have components of well-defined molecular structure and molecular weight. The functional groups attached to the polycarbocycle component comprise at least one t-butyl ester group or other acid sensitive group. Additional functional groups attached to the polycarbocycle component could be hydrophilic moieties for adhesion purposes, increase of intermolecular forces and possibly solubility improvement.

DESCRIPTION OF THE FIGURES

The following Figures illustrate the invention and show:

FIG. 5: shows the molecular formulae of representative polycarbocycle molecules according to the invention.

Figure 1:
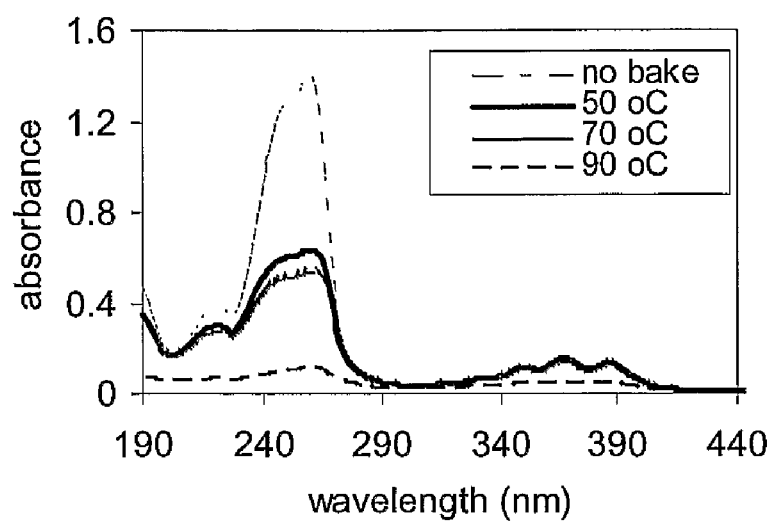
FIG. 1: Estimation of M5 molecule ceiling temperature using absorption spectra, taken after various baking temperatures. The ceiling temperature according to the data shown is lower than 50° C.

a. DETAILED DESCRIPTION OF THE SYNTHETIC STRATEGIES FOLLOWED FOR THE PREPARATION OF THE NEWLY SYNTHESIZED MOLECULAR PHOTORESISTS

All the novel anthryl derivatives were prepared starting from commercially or synthetically available mono- or di-substituted anthracenes. Consequently, several reported synthetic methods had to be modified or totally bypassed with new ones, in order to achieve efficient synthetic routes for the target molecules. In the illustrative examples depicted in the following schemes, the synthetic strategy includes the connection of a properly functionalized polycarbocycle A (see summary of invention) to a central polyfunctionalized aromatic or aliphatic core. Connection of the different units was succeeded either via an esterification method, or an epoxide opening reaction, while for the functionalization of polycarbocyles, such as anthracene or steroid moieties various methods were used, such as esterification in alkaline or acidic conditions and metal catalyzed C—C bond formation methods, such as Heck reaction. In the same manner, introduction of an acid sensitive group, such as a tert-butyl ester, coupling of a carboxylic acid with isobutylene or tert-butanol was exploited.

Method 1. Synthesis of Compounds of the Formula I.

For the synthesis of compounds of the formula I, A and B units were directly connected to a central core.

An illustrative example is depicted in Scheme 1. The method includes coupling of carboxylic acids of the type 1 with other polycabocyclic moieties, such as steroids, anthracenes or adamantanes to form mixed derivatives, or alkyl groups, such as tert-butyl or tetrahydropyranyl to form acid sensitive di-anthryl esters of the type 2.

Scheme 1. Synthesis examples for anthryl derivatives of the formula I.

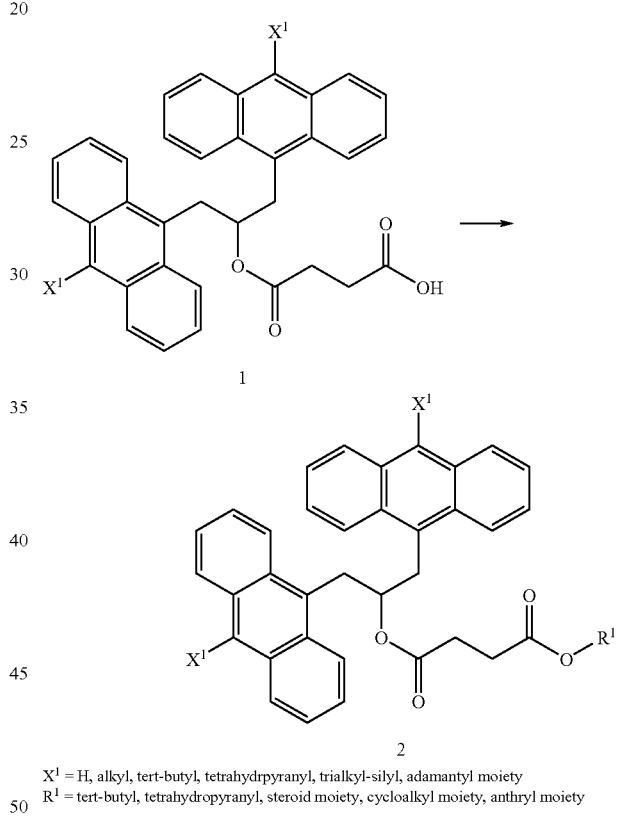

$X^1$ = H, alkyl, tert-butyl, tetrahydrpyranyl, trialkyl-silyl, adamantyl moiety
$R^1$ = tert-butyl, tetrahydropyranyl, steroid moiety, cycloalkyl moiety, anthryl moiety Coupling may be succeeded via typical esterification methods with alcohols under alkaline or acidic conditions or coupling with alkenes under acidic conditions.

Method 2. Synthesis of Compounds of the Formula II

For the synthesis of photoresists of the formula II a central core connected to A, B units via a linker. As cores, commercially available aromatic or aliphatic polyfunctionalized compounds were used, with or without further modification.

Some representative examples for the preparation of photoresists of the formula II, include:

a) the use of a central aromatic core, such as 3,5-dihydroxy-benzoic acid which after conversion to chloride 5 was coupled with polycarbocycles, such as anthracene, steroid, or adamantyl moieties to afford compounds of the type 8, 9 and 10.

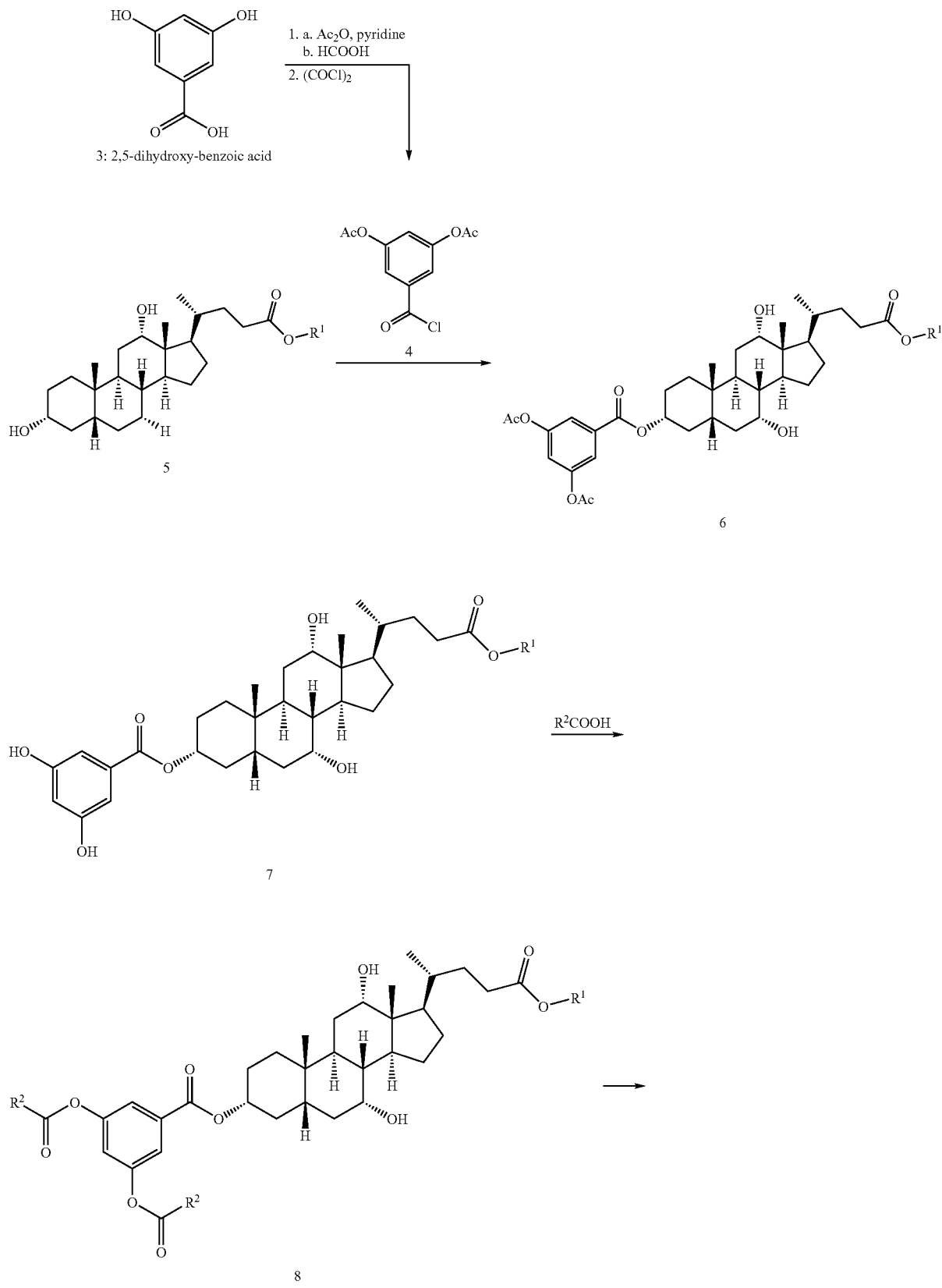
Scheme 2. Synthesis examples for anthryl derivatives of the formula II.

-continued

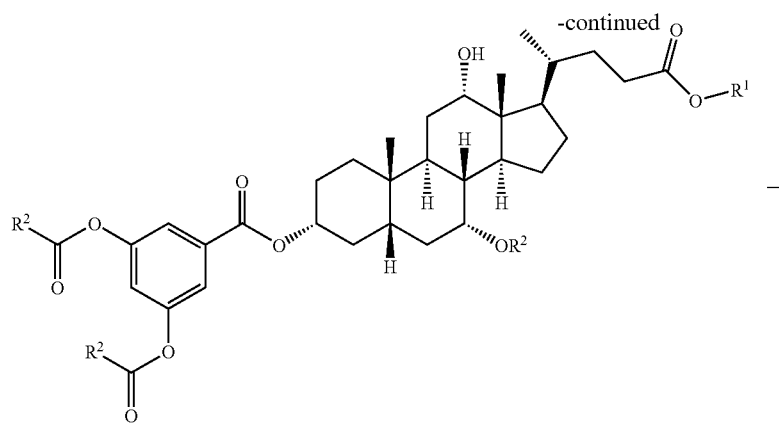

9

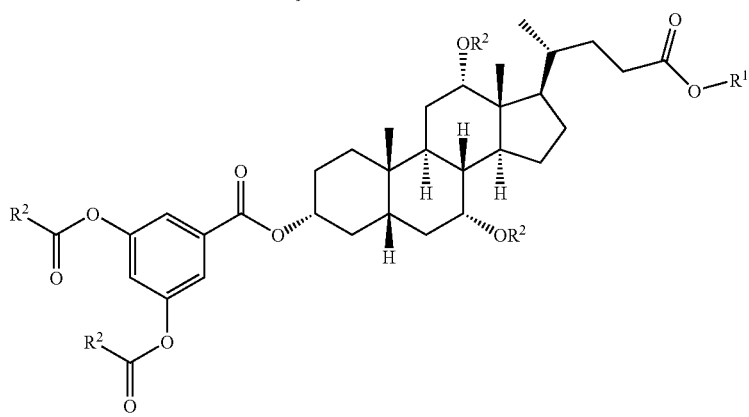

10

$R^1$ = H, alkyl, t-Bu-, 9-anthrylmethyl

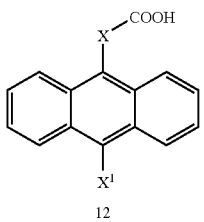

11

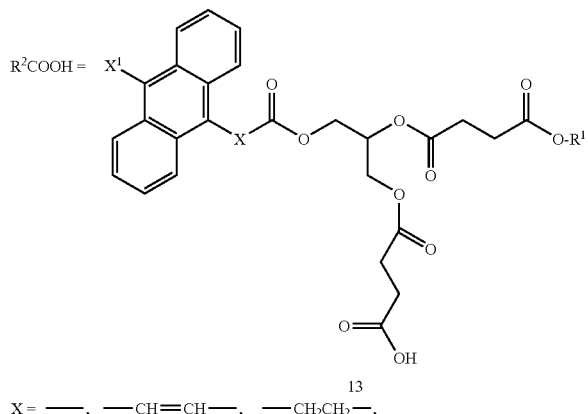

13

X = ———, —CH═CH—, —CH$_2$CH$_2$—,
$X^1$ = —H, —COOC(CH$_3$)$_3$

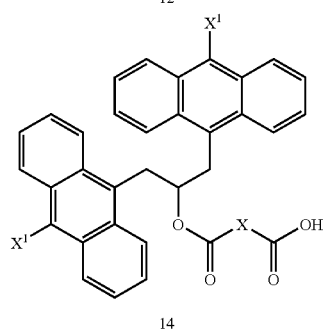

14

Further esterification of 8 with acids $R^2$COOH may take place in one or more steps to afford derivatives of the type 9 and 10 containing the same or different $R^2$— substituents.

Synthetic routes followed for the preparation of some representative carboxylic acids from the group of 11-14 are depicted in the following schemes:

Scheme 3. Synthesis example for carboxylic acids of the type 11.
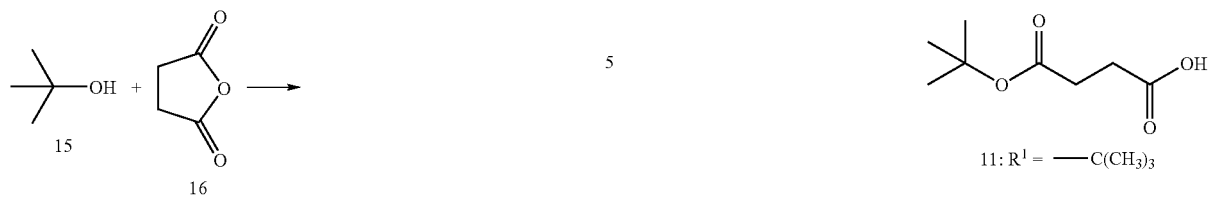
Scheme 4. Synthesis examples for carboxylic acids of the type 12.
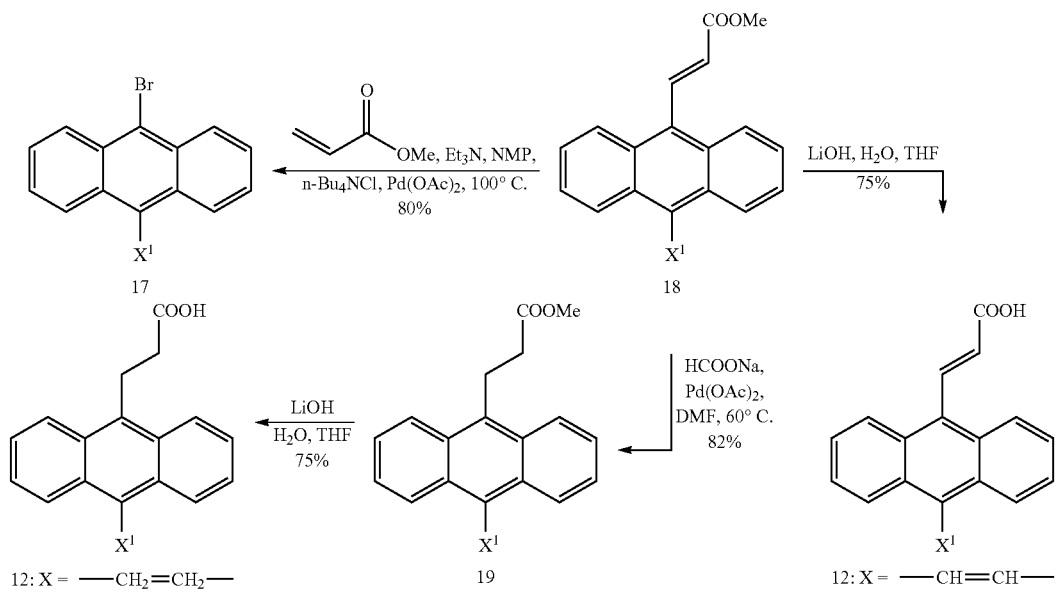
Scheme 5. Synthesis examples for carboxylic acids of the type 13.
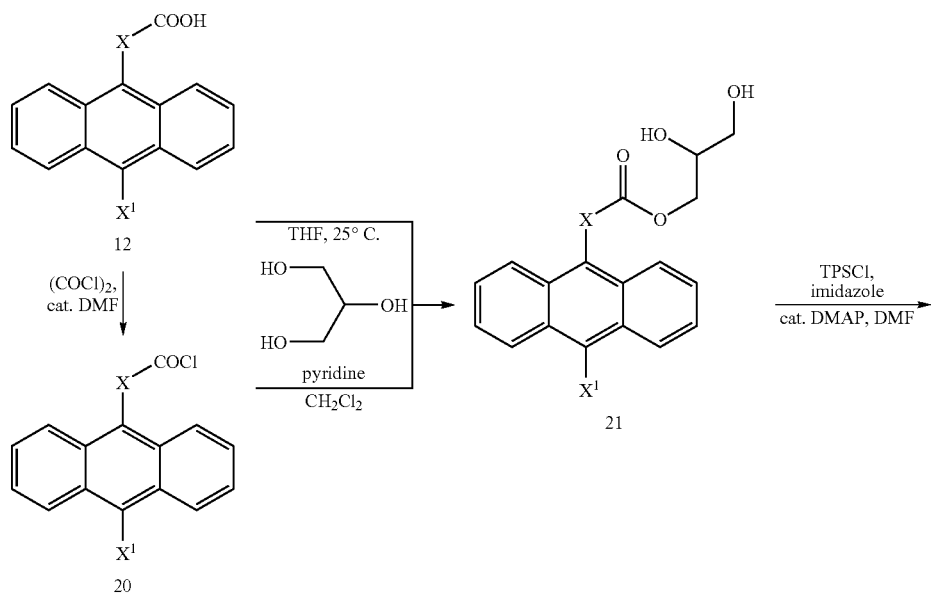

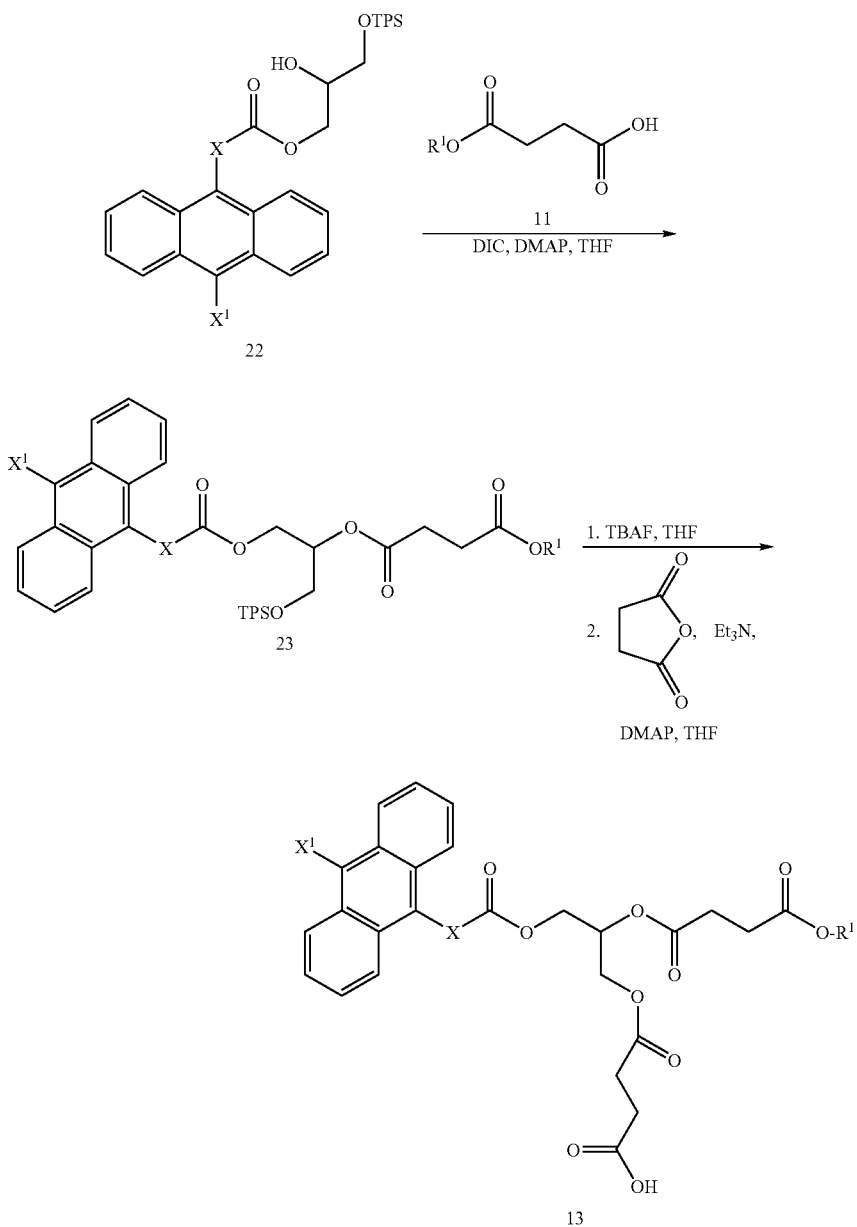

X = ——, —CH=CH—, —CH$_2$CH$_2$—
X$^1$ = —H, —COOC(CH$_3$)$_3$ b) the use of a trifunctionalized aliphatic core, such as glycerol 24 to which polycarbocycles, such as anthracene, steroid, or adamantyl moieties are connected via esterification for the formation of compounds of the type 25. A representative synthetic route is depicted in the following scheme.

Scheme 6. Synthesis examples for anthryl derivatives of the formula II.

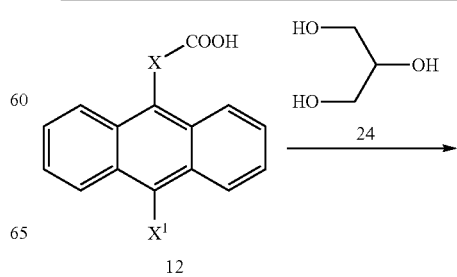

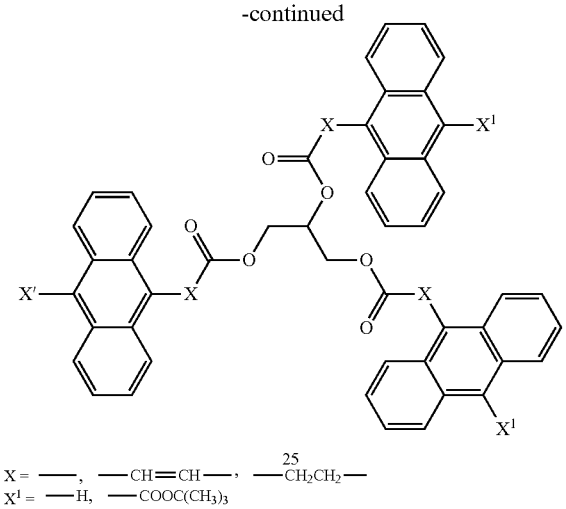

Esterification of glycerol with acids 12, may take place in one or more steps to afford esters having the same or different anthryl moieties, respectively.

c) the use of a polyfunctionalized aliphatic core, such as pentaerythritol 26 to which polycarbocycles, such as anthracene, steroid, or adamantyl moieties are connected via esterification for the formation of compounds of the type 27, 30, 31 and 32. Representative synthetic routes are depicted in the following schemes.

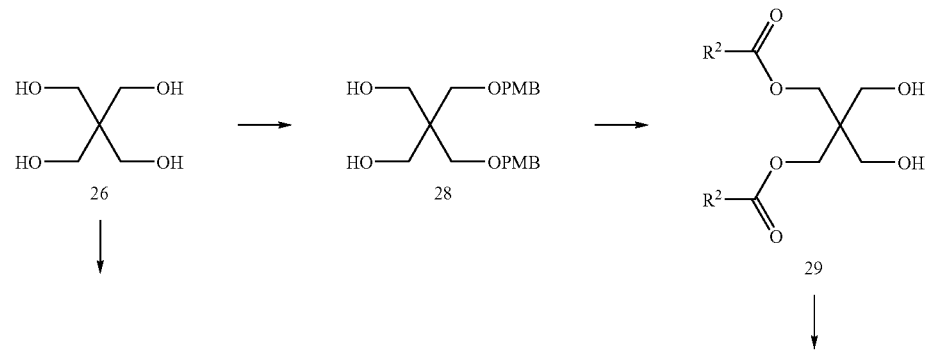

Scheme 7. Synthesis examples for anthryl derivatives of the formula II.

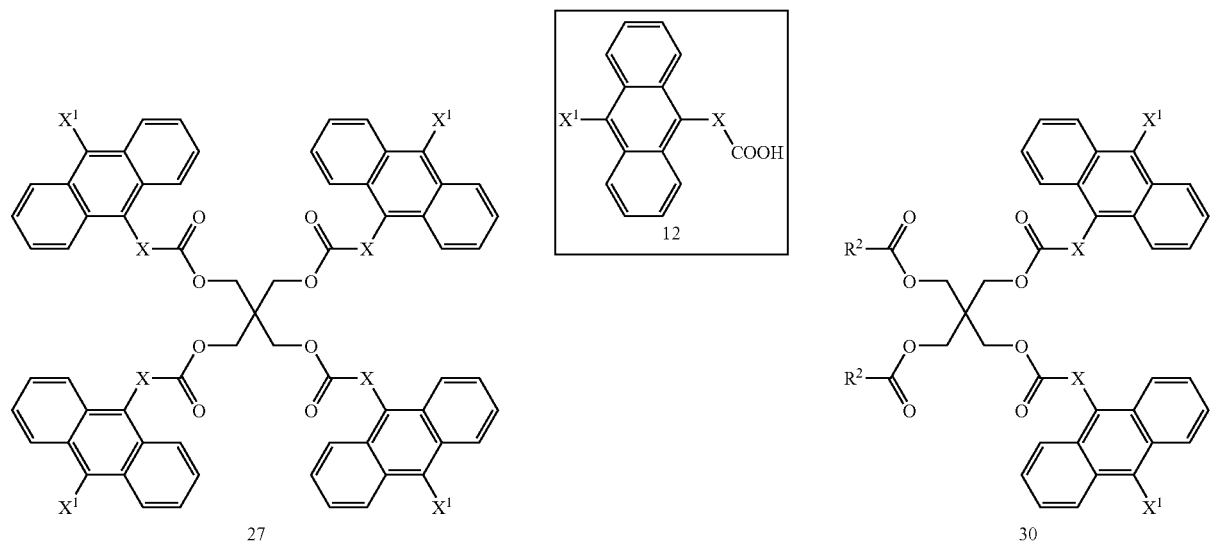

Scheme 8. Synthesis examples for anthryl derivatives of the formula II.
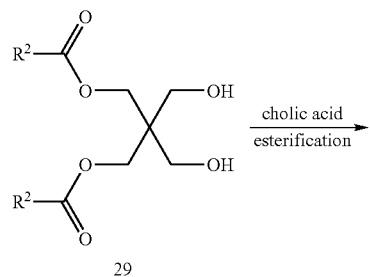
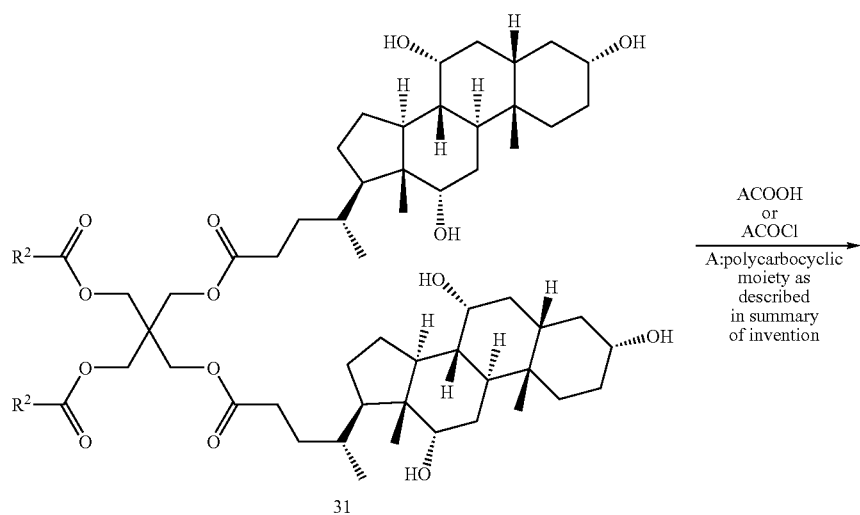
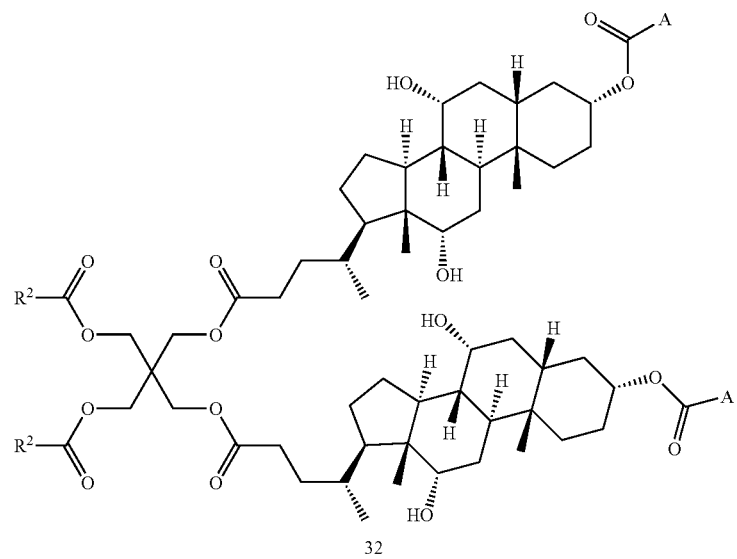

b. SYNTHESIS EXAMPLES

Example A

An illustrative example for the synthesis of anthryl derivatives of the formula I, is:

Preparation of Succinic acid 2-anthracen-9-yl-1-anthracen-9-ylmethyl-ethyl ester tert-butyl ester M4 [2, $X^1$=H, $R^1$=—$C(CH_3)_3$]:

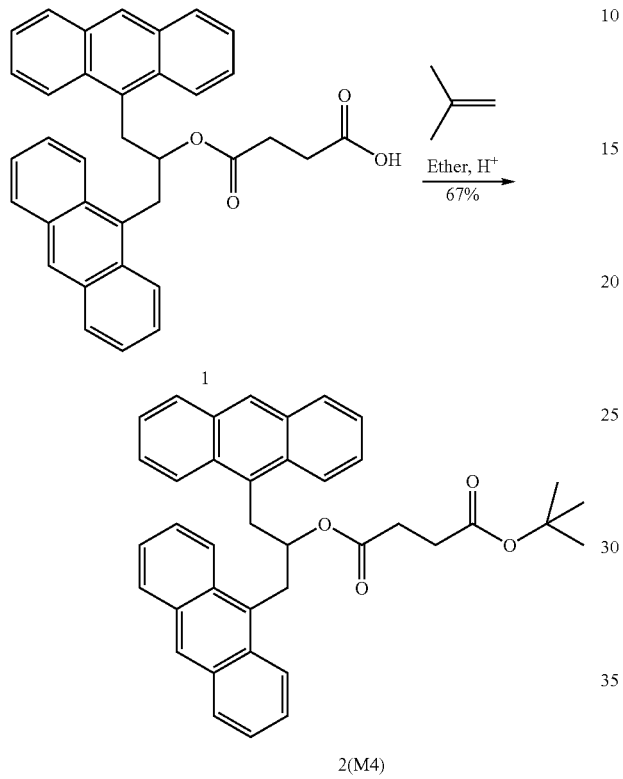

Dry ether (5 mL) was taken in an autoclave tube provided with an atmosphere of argon. The mixture was cooled to −40° C., and then isobutene was purged, followed by addition of acid 1 (3.0 gm, 5.85 mmol), prepared according to Powell (M. F. Powell, *J. Org. Chem.* 1987, 52, 56-61). The mixture was stirred and catalytic amount of conc. $H_2SO_4$ in dry ether was added to the mixture. The tube was properly closed and vigorously stirred at room temperature for 3 days.

After completion of the reaction the mixture was cooled to −40° C., opened safely, and warmed slowly to room temperature, allowing evaporation of excess isobutylene. The mixture was treated with aqueous solution of sodium bicarbonate and extracted with ethyl acetate. The organic layer was washed with water and then with brine, dried over anhydrous sodium sulfate. The solvent was evaporated under vacuo and the residue was separated by flash column chromatography on silica gel/hexane-$CH_2Cl_2$ (4:6) affording the product 2 (M4) (2.6 gm). Crystallization of the product with ethyl acetate-hexane gave analytical pure sample as a yellowish needless crystals (2.236 gm, 67%).

Example B

An illustrative example for the synthesis of anthryl derivatives of the formula II possessing an aromatic central core, is:

Preparation of M17 [7, $R^2$COOH=13 (X=—$CH_2$, $X^1$=H, $R^1$=—$C(CH_3)_3$]:

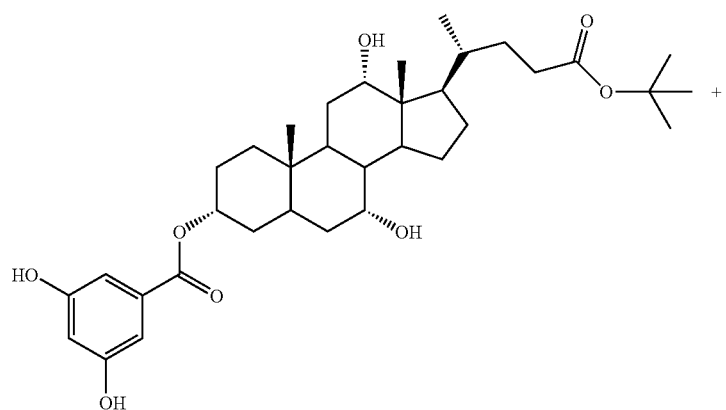

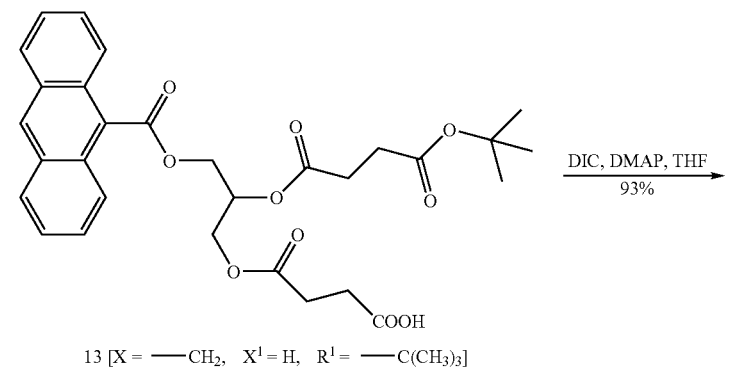

13 [X = —CH$_2$, X$^1$ = H, R$^1$ = —C(CH$_3$)$_3$]

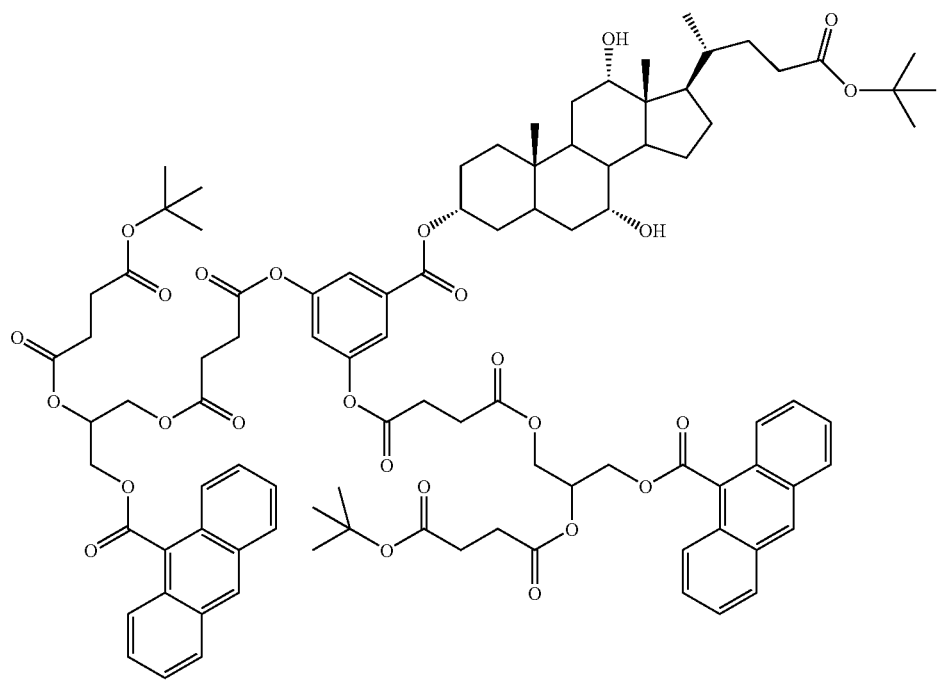

M17

To a solution of a well-dried mixture of dihydroxy derivative 7 (3.404 g, 5.66 mmol) and acid 13 (7.20 g, 13.03 mmol) in dry THF (16 mL) were added DIC (2.7 mL, 16.99 mmol) and 4-DMAP (173 mg, 1.42 mmol) in an ice-cold bath under an argon atmosphere. The mixture was stirred at this temperature for 20 min and then it was stirred further at ambient temperature for 1.5 h (monitored by tlc). The mixture was quenched with aqueous saturated solution of ammonium chloride and then diluted with ethyl acetate. The organic layer was extracted and washed with brine, dried over anhydrous sodium sulfate. The solvent was removed on a rotary evaporator and the residue was separated by flash column chromatography on silica gel/hexane-ethyl acetate (7:3) to give M17 (10.00 g, 93%) as oil, which was slowly crystallized as a colorless crystalline solid.

$^1$H NMR (CDCl$_3$, 250 MHz) $\delta_H$: 8.52 (s, 2H), 8.15-7.95 (m, 8H), 7.61 (d, 2H, J=1 Hz), 7.57-7.44 (m, 9H), 5.45-5.55 (m, 2H), 4.93 (dd, 1H, J=12, 5 Hz), 4.78 (brs, 1H), 4.69 (dd, 1H, J=12, 5 Hz), 4.47 (dd, 1H, J=12, 5 Hz), 4.31 (dd, 1H, J=12, 5 Hz), 3.96 (brs, 1H), 3.82 (br s, 1H), 2.93-2.73 (m, 8H), 2.62-2.47 (m, 8H), 1.43 (s, 9H), 1.42 (s, 18H) ppm.

Example C

An illustrative example for the synthesis of anthryl derivatives of the formula II, containing as a central aliphatic core glycerol 24, is:

Preparation of M19 [25, X=—CH$_2$CH$_2$—, X$^1$=—COOC(CH$_3$)$_3$]:

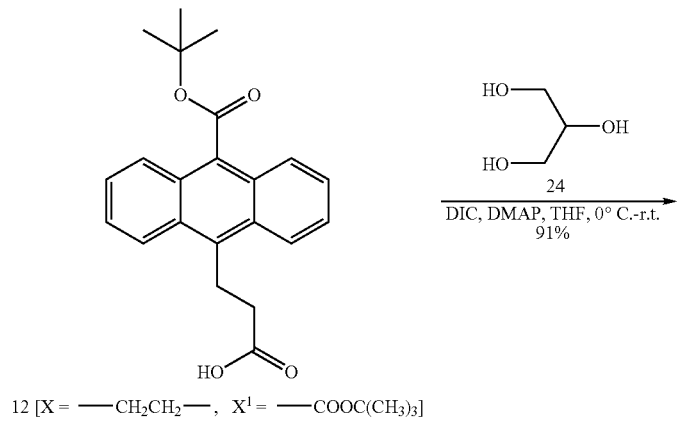

12 [X = —CH$_2$CH$_2$—, X$^1$ = —COOC(CH$_3$)$_3$]

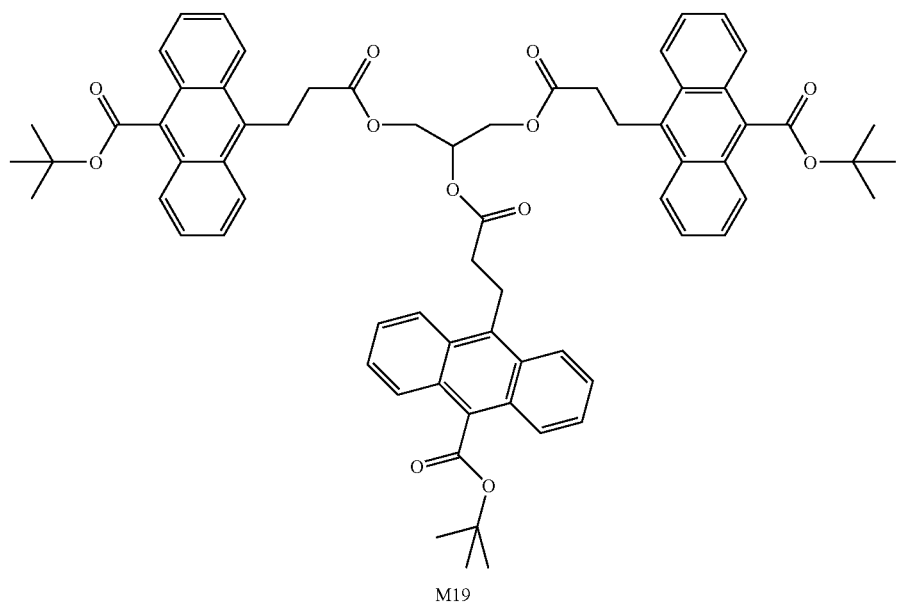

M19

To an ice-cold solution of a well-dried mixture of glycerol 24 (36 mg, 0.39 mmol) and acid 12 (547 mg, 1.56 mmol) in dry THF (1.2 mL) DIC (0.367 mL, 2.34 mmol) and 4-DMAP (23 mg, 0.188 mmol) were added in an ice-cold bath under an argon atmosphere. The mixture was stirred at this temperature for 20 min and then stirred further at ambient temperature for 2 h (monitored by tlc). The mixture was quenched with aqueous saturated solution of ammonium chloride and then diluted with ethyl acetate. The organic layer was extracted and washed with brine, dried over anhydrous sodium sulfate. The solvent was removed on a rotary evaporator and the residue was separated by flash column chromatography on silica gel/hexane-ethyl acetate (8:2) to give M17 (387 mg, 91%), as a yellow crystalline solid.

$^1$H NMR (CDCl$_3$, 250 MHz) $\delta_H$, 8.25 (dd, 6H, J=8, 2 Hz), 8.02 (dd, 6H, J=7, 1 Hz), 7.57-7.37 (m, 12H), 5.47-5.47 (m, 1H), 4.46 (dd, 2H, J=12, 5 Hz), 4.24 (dd, 2H, J=12, 5 Hz), 3.98 (t, 6H, J=8 Hz), 2.81 (t, 6H, J=8 Hz), 1.77 (s, 27H) ppm.

Example D

An illustrative example for the synthesis of anthryl derivatives of the formula II, containing as a central aliphatic core pentaerythritol 26, is:

Preparation of M21 [27, X=—CH=CH—, X¹=—COOC(CH₃)₃]:

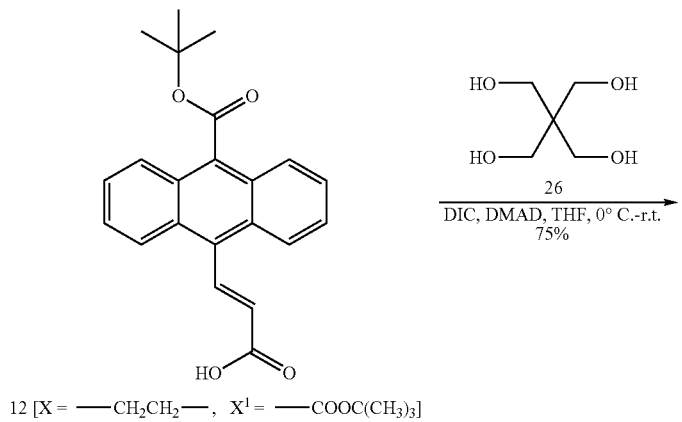

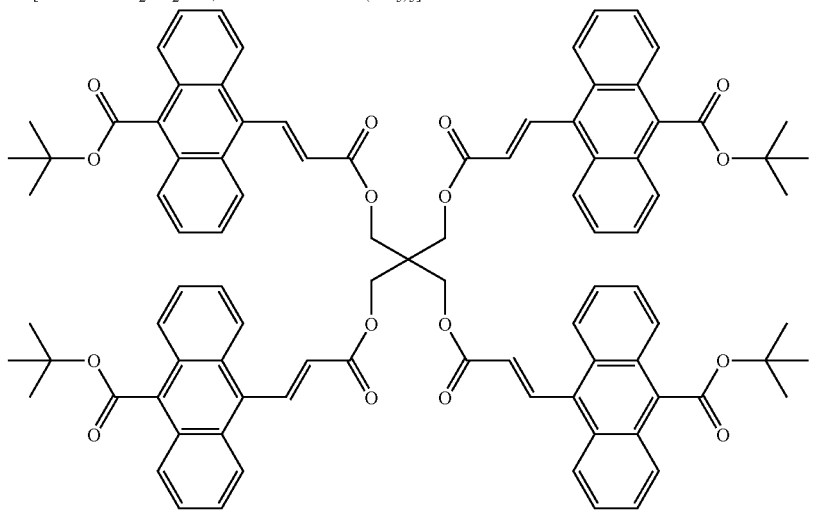

M21

To an ice-cold solution of a well-dried mixture of pentaerythritol 26 (468 mg, 3.44 mmol) and acid 12 (6.0 gm, 17.222 mmol) in dry THF (45 mL), DIC (3.8 mL, 24.26 mmol) and 4-DMAP (420 mg, 3.43 mmol) were added, under an argon atmosphere. The mixture was stirred at this temperature for 20 min and then stirred further at ambient temperature overnight. The mixture was quenched with aqueous saturated solution of ammonium chloride and then diluted with ethyl acetate. The organic layer was extracted and washed with brine, dried over anhydrous sodium sulfate. The solvent was removed on a rotary evaporator and the residue was separated by flash column chromatography on silica gel/Hexane-ethyl acetate (8:2) to give M21 (3.8 gm, 75%), as a yellow crystalline solid.

$^1$H NMR (CDCl₃, 250 MHz) $δ_H$, 8.70 (d, 4H, J=16 Hz), 8.19 (dd, 8H, J=8, 2 Hz), 8.01 (dd, 8H, J=8, 2 Hz), 7.54-7.33 (m, 16H), 6.49 (d, 4H, J=16 Hz), 4.72 (s, 8H), 1.79 (s, 36H) ppm.

c. RELATION OF THE FUNCTIONAL GROUPS INCORPORATION TO THE PHYSICOCHEMICAL AND LITHOGRAPHIC PROPERTIES

The new molecules synthesized possess an etch-resistant anthracene core and the remaining functional groups or polycarbocycles are anchored to this core. Capability for uniform film formation by spin-coating and stability during processing are achieved by suitably functionalizing the molecular structure.

Mono- or poly-anthracene based polycarbocycles combining hydrophilic groups such as ether groups, hydroxyl groups and/or cholic acid derivatives with free OH groups, show good solubility in organic solvents and good film forming properties. The films are easily obtained by spin coating. Molecular interactions render the molecule more stable under thermal processing treatment. In addition, suitable combinations of the previous mentioned groups are enhancing the interaction between the molecule and the substrate improving the adhesion to it and allowing straightforward processing.

Thermal stability is also affected by glass transition temperature. Thus, molecular materials are functionalized in order to have desired glass transition temperature values. The glass transition temperature depends upon the molecular size and weight and on the introduction of suitable substituents, i.e. on the incorporation of structurally rigid moieties which decrease the flexibility. The glass transition temperature is also critical for the choice of the best processing conditions, i.e. post apply bake and post exposure bake. The latter is important for the chemical amplification reaction accomplishment. Thus, the difference between post exposure temperature and material's glass transition temperature has an effect to sensitivity.

In addition, correlation between the number of the different groups present, e.g. the cholic acids, the anthracene groups, the t-butyl ester groups, as well as the ratio of the molecular weight per the number of the different groups present in the molecule, and the lithographic behavior is observed. The MW/number of t-butyl ester groups and the MW/number of anthracenes, are for example related to the sensitivity and etching rate respectively.

d. DETAILED DESCRIPTION OF THE PHYSICOCHEMICAL CHARACTERIZATION AND OF THE EVALUATION OF SYNTHESIZED MOLECULES AS RESIST COMPONENTS

Example 1

A 4% w/w solution of one of the synthesized polycarbocycle molecules in methyl isobutyl ketone (MIBK) was prepared. The solution was stirred at room temperature for a few hours and the polycarbocycle molecule was dissolved. A small amount of the solution was used to spin coat a film on quartz substrate at 2000 rpm for 30 sec and the absorption spectrum of the film was taken. Then, the film was heated on a hotplate at 50, 70, 90, 100, 110, 130, 150, 160, 190, 200, 250° C. for 2 min each time. The absorption spectra taken after each heating step were compared and the polycarbocycle's ceiling temperature (temperature up to which no significant decomposition, or sublimation takes place) was estimated.

Figure 2:
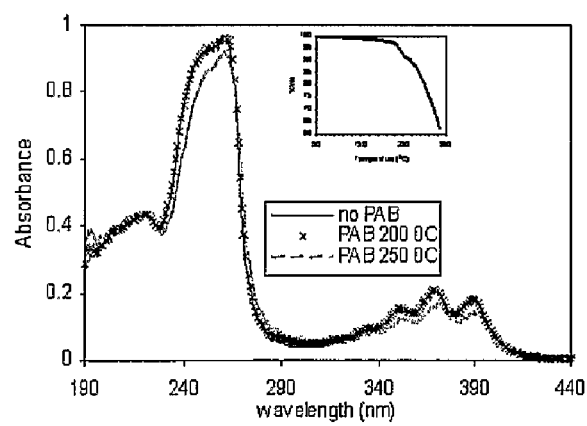
FIG. 2: Estimation of M18 molecule ceiling temperature, using absorption spectra taken after baking at different temperatures and thermogravimetric analysis (inside picture). The ceiling temperature appears higher than 200° C.
Figure 3:
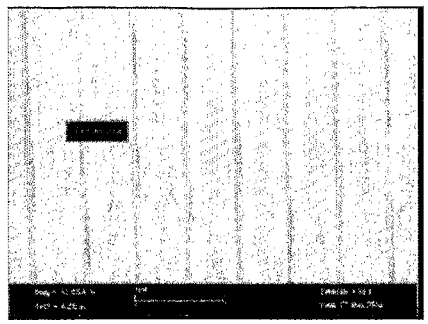
FIG. 3: SEM images of positive-tone line/space patterns for M17 resist loaded with 20% PAG under exposure to 50 keV electron-beam. Process conditions: PAB 100° C./2 min, PEB 70° C./2 min, development in TMAH 0.26N for 20 s.
Figure 3:
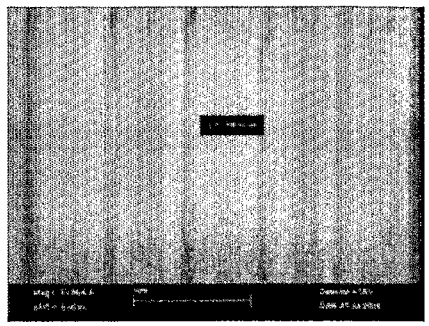
Figure 4:
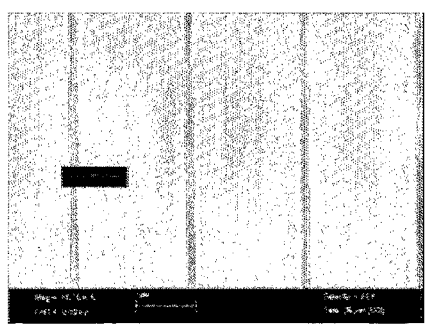
FIG. 4: SEM images of positive-tone line/space patterns for M18 resist loaded with 20% PAG under exposure to 50 keV electron-beam. Process conditions: PAB 100° C./2 min, PEB 100° C./2 min, development in TMAH 0.26N for 20 s.
Figure 4:
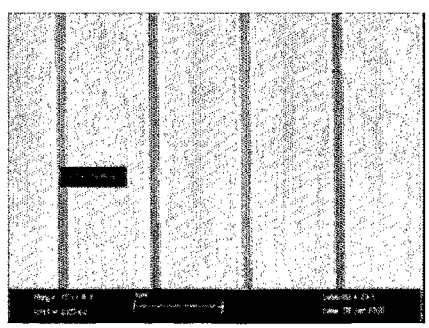

The above experiment, at comparable baking cycles, was performed for all the materials synthesized. Representative results are shown in Table 1 and in FIGS. 1 and 2. Materials containing free —OH or O groups seem to be stable even at elevated temperatures.

TABLE 1

Newly synthesized polycarbocycle molecules and their ceiling temperature

| New molecules | Ceiling Temperature (° C.) |
|---|---|
| M4 | 90 |
| M5 | Lower than 50 |
| M11 | 110 |
| M16 | 160 |
| M17 | 110 |
| M18 | 250 |
| M19 | 160 |
| M20 | 150 |
| M21 | 150 |
| M22 | 200 |

Example 2

A small amount of the synthesized polycarbocycle molecules was used in MDSC experiments to determine their glass transition temperature. The glass transition temperature provides a first guide for the selection of baking limits in such a way so that the lithographic patterns do not collapse due to material melting. Representative results are shown in Table 2. From this table is evident that molecules containing a higher number of flexible, easily rotating groups have a lower glass transition temperature value and vice versa, i.e. the more rigid the molecule the higher the glass transition temperature value is.

TABLE 2

New polycarbocycle molecules and their glass transition temperature

| New molecules | Glass transition temperature ° C. |
|---|---|
| M16 | 34 |
| M17 | 37 |
| M18 | 63 |
| M19 | 30 |
| M20 | 45 |
| M21 | 57 |
| M22 | 20 |

Example 3

A polycarbocycle molecule solution was used to form a film by spin coating on a 3" silicon wafer as described in example 1 and it was post-apply baked on a hotplate at 100° C. for 2 min. On another substrate a PHS film was spin coated and post-apply baked on a hotplate at 150° C. for 2 min.

The films were placed in the chamber of a Reactive Ion Etcher and thickness was measured in situ with an ellipsometer. Then the films were etched in $O_2$ plasma with source power of 600 W. The etching conditions were the following: $O_2$ flow 100 sccm, bias voltage −100V, electrode temperature 15° C., reactor pressure 1.33 Pa.

Several etching experiments performed to evaluate the behavior in $O_2$ plasma of all the molecules synthesized. Representative results are shown in Table 3 indicating a decrease in etch rate in cases of molecules with high carbon atom content or with lower numbers of O atoms.

TABLE 3

New polycarbocycle molecules and their etch rate under $O_2$ plasma treatment

| New molecules | ETCH RATE (nm/min) |
|---|---|
| M4 | 106.38 |
| M11 | 118.48 |
| M12 | 128.13 |
| M14 | 116.99 |
| M15 | 111.53 |
| M16 | 149.72 |
| M17 | 142.22 |
| M18 | 117.80 |
| M19 | 120.01 |
| PHS | 148 |

Example 4

A solution of M17 4% w/w in methyl isobutyl ketone (MIBK) was first prepared and various quantities (in % w/w with respect to the polycarbocycle mass) of triphenyl sulfonium antimonate, used as photoacid generator, were added in the solution. The new solution was stirred at room temperature for a few hours until the components were dissolved and then this new solution was used as resist. A thin film from the M17-based resist solution was spin coated at 2000 rpm for 30 sec on a 3" silicon wafer, already coated with a hard baked organic material (AZ5214 purchased by Clariant), and post-applied baked on a hotplate at 100° C. for 2 min. The M17 resist film thickness measured with a profilometer was ~100 nm.

Then, films were broadband exposed using a 500 W Hg—Xe exposure tool through a lithographic mask for various doses (time of exposure). Different post-exposure bake temperatures were also applied. The films were developed in TMAH 0.26N (AZ 726 MIF purchased by Clariant) for 25 sec, rinsed with H₂O and dried in a N₂ flow.

The exposed areas were dissolved indicating positive lithographic behavior. Then, films of M17 resist were broadband exposed using a 500 W Hg—Xe exposure tool, through a lithographic mask with features of the order of 1 μm in contact with the resist film, for various doses. Different post-exposure bake temperatures were also applied. A series of M17 resist formulations, with various loadings of photoacid generator, were studied for their lithographical behavior. The ratio of 20% w/w of photoacid generator per polycarbocycle molecule mass was chosen for the following imaging experiments. The films were developed as above. The exposed areas were dissolved indicating high resolution lithographic capability. A 2 min post-exposure bake step at 70° C. was chosen as giving best results under the conditions examined.

In a subsequent experiment films of M17 resist were exposed with an electron beam exposure tool and lines of 1000, 500, 250, 100 nm were scanned for various doses. Post-exposure bake at 70° C. for 2 min was applied. The films were developed as above. The exposed areas were dissolved and lines down to 100 nm were obtained, showing high-resolution lithographic capability.

The same steps as previous were followed for M18-based resist formulations loaded with 20% w/w of photoacid generator. This study showed first positive lithographic behavior, and second, high resolution lithographic capability at higher doses than that required for M17 resist. The post-exposure bake step in this case was performed at 100° C. for 2 min.

In a subsequent experiment films of a M18-based resist formulation were exposed with electron beam exposure tool as above described for the M17-based resist formulation. Post-exposure bake at 100° C. for 2 min was applied. The films were developed as above. The exposed areas were dissolved and 100 nm lines were obtained showing high resolution lithographic capability. In this case higher doses than the ones used for the M17-based resist were used, despite the fact that the post-exposure bake temperature was higher (100° C. for 2 min instant of 70° C.).

Example 5

Solutions of M16-0 and M16-A molecules, 4% w/w in methyl isobutyl ketone (MIBK) were used to prepare resist formulations using triphenyl sulfonium antimonate as photoacid generator at loadings of 20% w/w per polycarbocycle mass. Then, 100 nm thick films of M16-0 and M16-A resist formulations were coated and post-applied bake as in example 4.

Films of M16-0 and M16-A resists were broadband exposed using a 500 W Hg—Xe exposure tool through a lithographic mask for various doses. Post-exposure bake steps at 100° C. for 2 min were applied for both resists in order to compare their sensitivities since the two the polycabocycle molecules (M16-0 and M16-A) have similar chemical structures differing mainly in the number of imaging groups per molecule.

The development procedure applied was as in example 4. In the case of M16-A higher doses than in the case of M16-0 were required. It should be noticed that M16-A has 2 imaging groups per molecule and a $T_g$ of 52° C. whereas the M16-0 has 3 imaging groups per molecule and a $T_g$ of 34° C.

The features disclosed in the present description, or the following claims, or the accompanying drawings, expressed in their specific forms or in terms of a means for performing the disclosed function, or a method or process for attaining the disclosed result, as appropriate, may, separately, or in any combination of such features, be utilized for realizing the invention in diverse forms thereof.

When used in this specification and claims, the terms "comprises" and "comprising" and variations thereof mean that the specified features, steps or integers are included. The terms are not to be interpreted to exclude the presence of other features, steps or components.

REFERENCES

1. T. Hirayama, D. Shiono, H. Hada, J. Onoda, M. Ueda, J. Photopol. Sci. Technol., 17, 435-440 (2004).
2. M. Yoshiiwa, H. Kageyama, Y. Shirota, F. Wakaya, K. Gamo, and M. Takai, Appl. Phys. Lett., 69, 2605 (1996).
3. T. Kadota, M. Yoshiiwa, H. Kageyama, F. Wakaya, K. Gamo, Y. Shirota, Proc. SPIE, Vol. 4345, 891, 2001
4. T. Kadota et al., Mat. Sci. Eng. C, 16, 91-94, (2001).
5. J-B. Kim, H-J Yun, Y-G Kwon, Chem. Let., 10, 1064-1065 (2002).
6. T. Kadota et al., Chem. Let., 33 (6) 706, (2004).
7. E. Gogolides, P. Argitis, E. A. Couladouros, V. P. Vidali, et al, *J. Vac. Sci. Technol. B* 2003, 21(1), 141
8. E. Gogolides, P. Argitis, E. A. Couladouros, V. P. Vidali, M. Vasilopoulou, G. Cordoyiannis, WO 03/038523 A3.

The invention claimed is:

1. Molecular lithographic resists having as main component a molecule combining two basic characteristics:
   a) the presence of at least two polycarbocyclic moieties per molecule, where at least one of them is an anthracene derivative and
   b) the presence of at least one acid sensitive group per molecule the general formulae of which polycarbocycle containing molecules is the following:

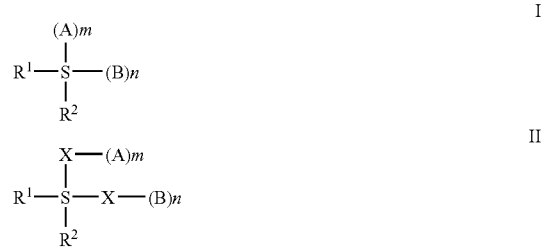

wherein in the above formulae I, II:

n or m is an integer of 1 to 4,

A represents an anthracene or adamantane or steroid moiety of the following structures:

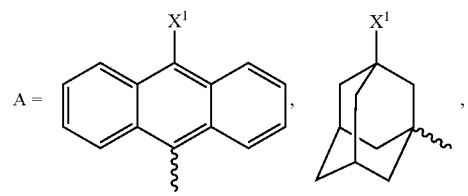

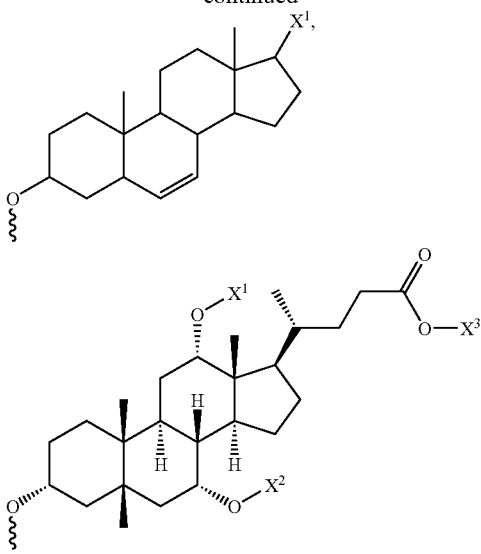

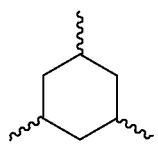

B is a hydrogen atom or an alkyl group or an alkoxy group or an acid sensitive alkyl carboxylic acid ester, or an additional moiety of the type A represented above, wherein if A is not an anthracene derivative in the formulae I, II, B is obligatory to be a moiety of the type A represented above containing at least one anthracene, and $R^1$, $R^2$ can be the same or different from one another and $R^1$ and $R^2$ are chosen from a hydrogen atom or an alkyl group or a linker of —XB having X connected to a moiety of B.

$X^1$, $X^2$, and $X^3$ is a hydrogen atom, or an alkyl group or a linker selected from the group consisting of alkyl, alkoxy-moieties —COCH$_2$CH$_2$—, and —COCH=CH— connected directly to an acid sensitive carboxylic acid ester;

X represents a linker from the group of —CH$_2$—, —O—, —COO—, —COCH$_2$—, —COOCH$_2$— or —CH$_2$CH$_2$COO—CH$_2$— or —CH=CH—COOCH$_2$— or —OCOCH$_2$CH$_2$—COOCH$_2$ or —OCO—CH=CH—COOCH$_2$— or —OCOCH$_2$CH$_2$— or —OCOCH=CH— or oxygenated aliphatic chain or carbocyclic aliphatic chain or carbocyclic polysubstituted aliphatic chain;

S represents a central aliphatic or cycloaliphatic or aromatic polyfunctionalized core of the following structures:

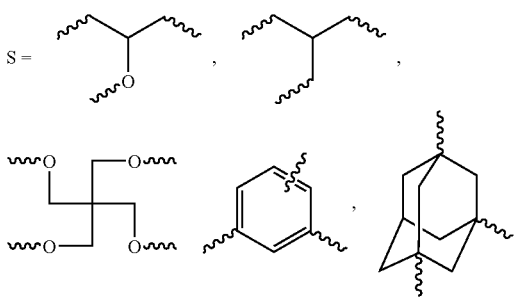

2. The molecular photoresists according to claim 1, wherein the alkyl group is methyl-, ethyl-, n-propyl-, isopropyl-, n-butyl-, isobutyl-, sec-butyl-, t-butyl-, n-pentyl-, n-hexyl-, n-octyl-, or n-dodecyl-groups.

3. The molecular photoresists according to claim 1, wherein the n alkoxy group is methoxy-, ethoxy-, propoxy-, butoxy-, methoxymethylenoxy-, or methoxyethylenoxy-group.

4. The molecular photoresists according to claim 1, wherein none of the linkers represents any kind of polymeric chain.

5. The molecular photoresists according to claim 1, characterised in that they also comprise a photoacid generator as second component.

6. The molecular photoresists according to claim 5, wherein the functional groups attached to the polycarbocyclic component comprise at least one t-butyl ester group or other acid sensitive group.

7. The molecular photoresists according to claim 5, wherein additional functional groups are attached to the polycarbocyclic component which are hydrophilic moieties used for adhesion purposes, increase of intermolecular forces or for solubility improvement.

8. The molecular photoresists according to claim 1 wherein said molecule is selected from

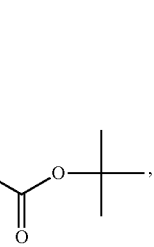

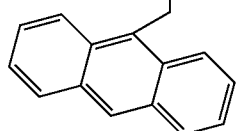

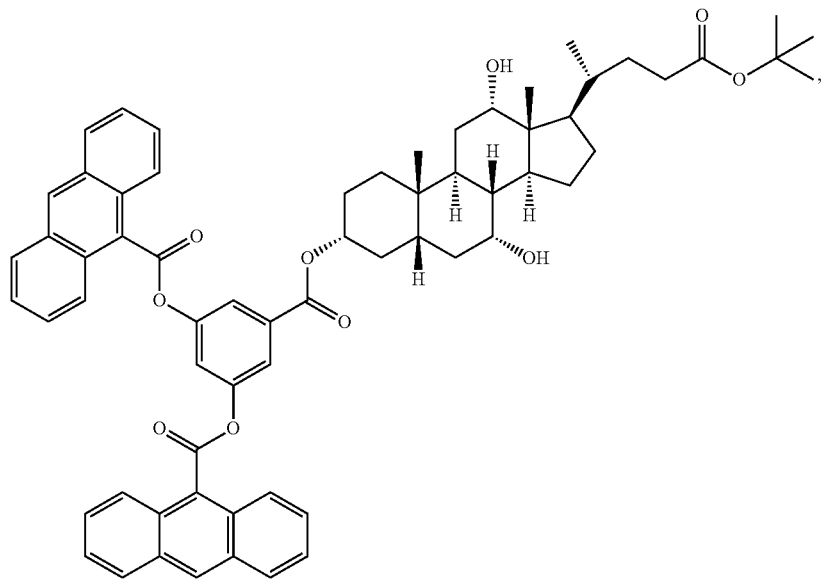
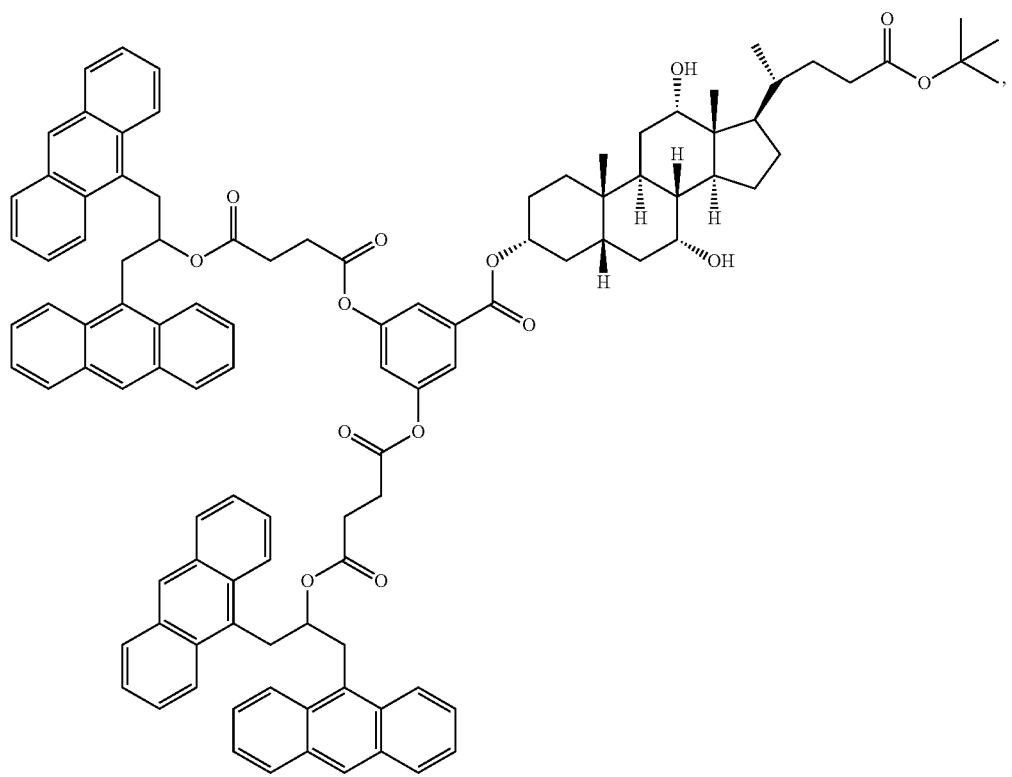

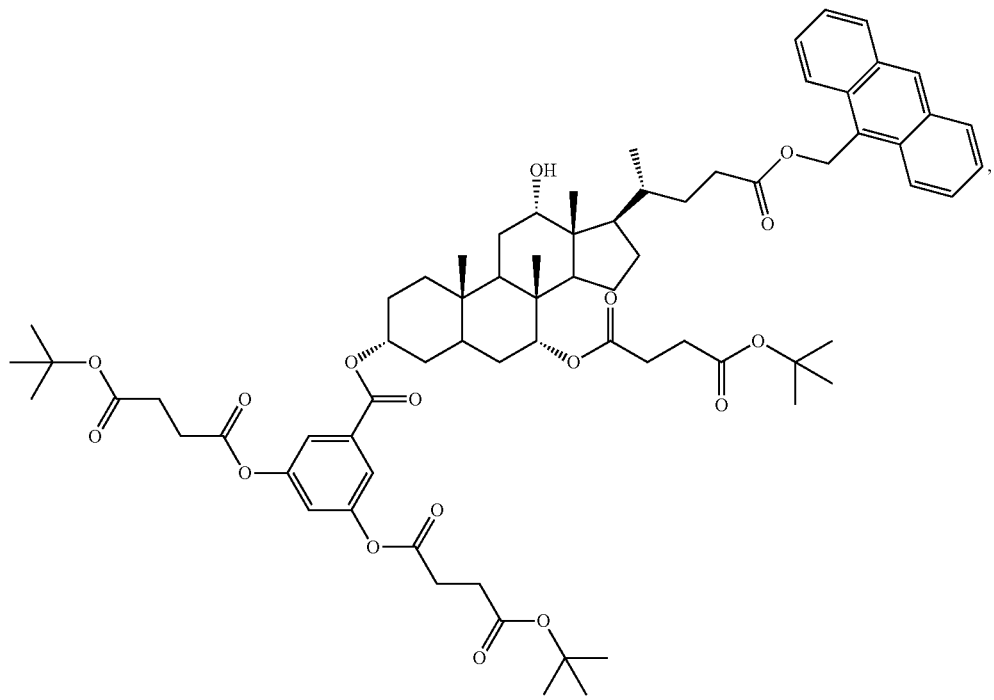
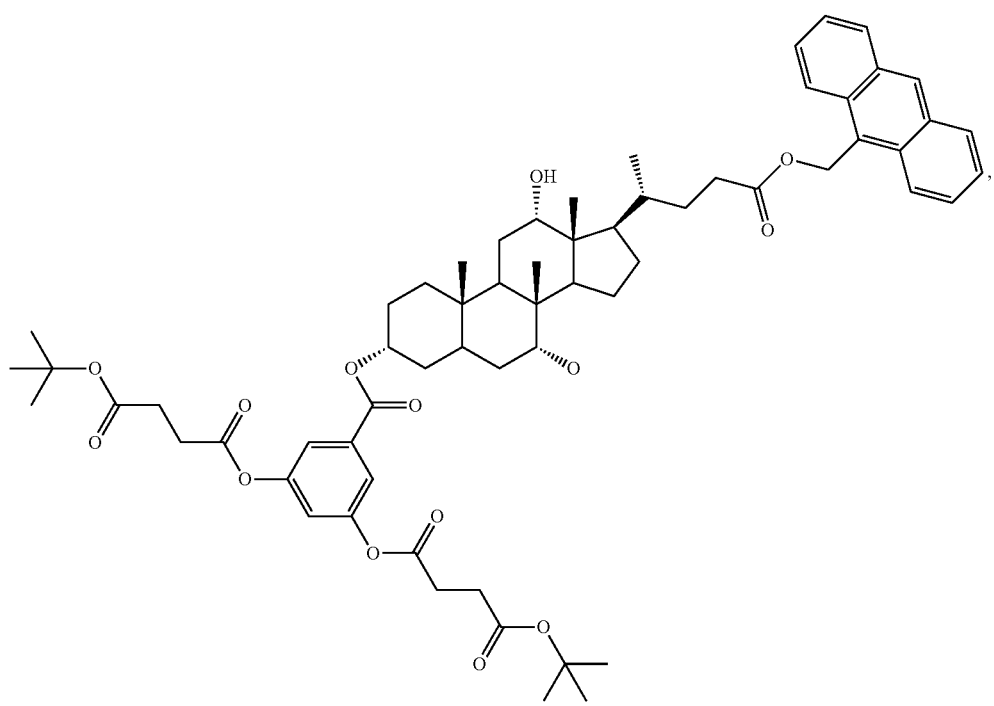

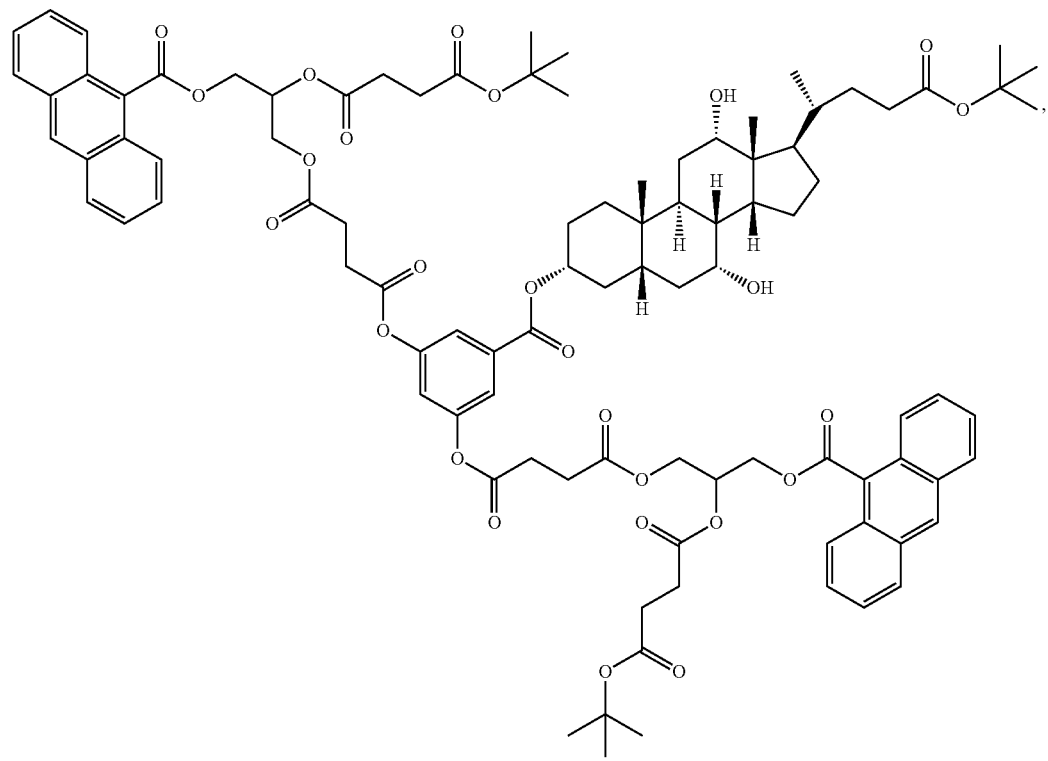
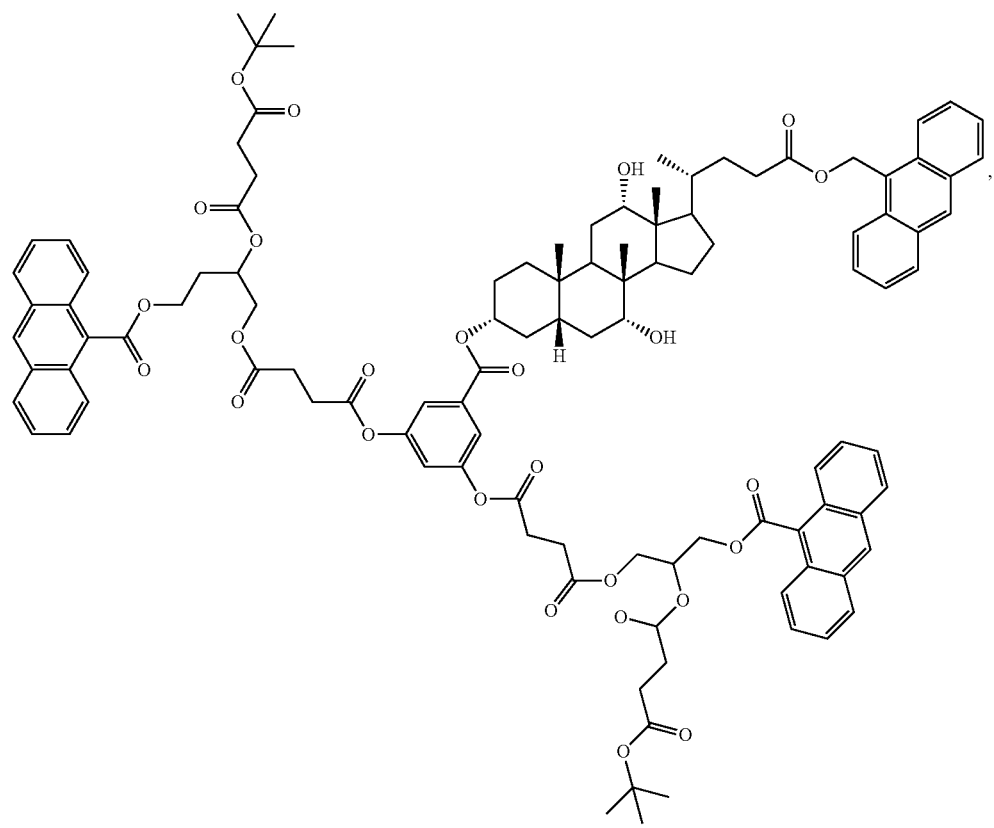

-continued
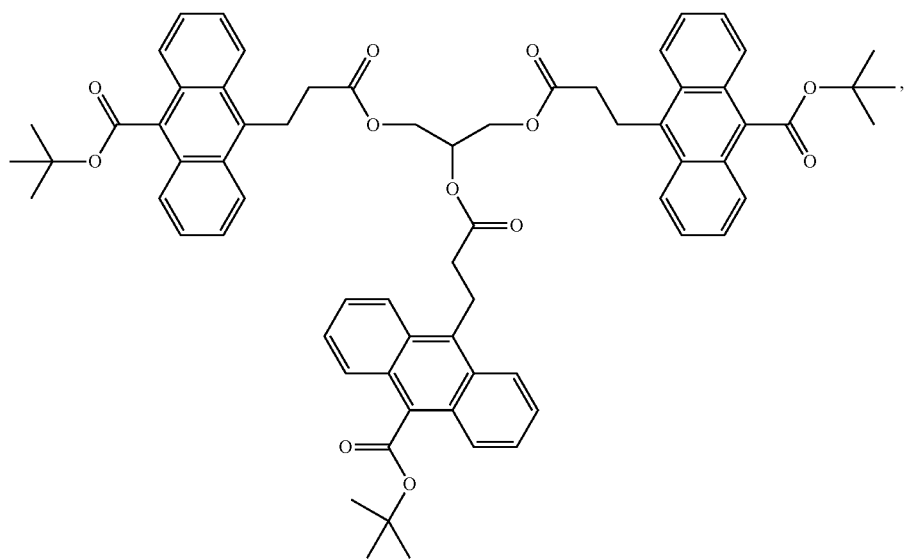
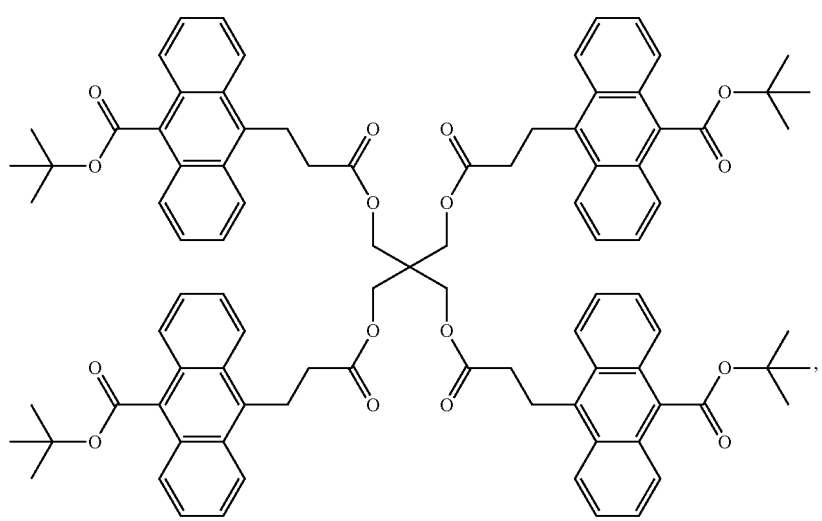
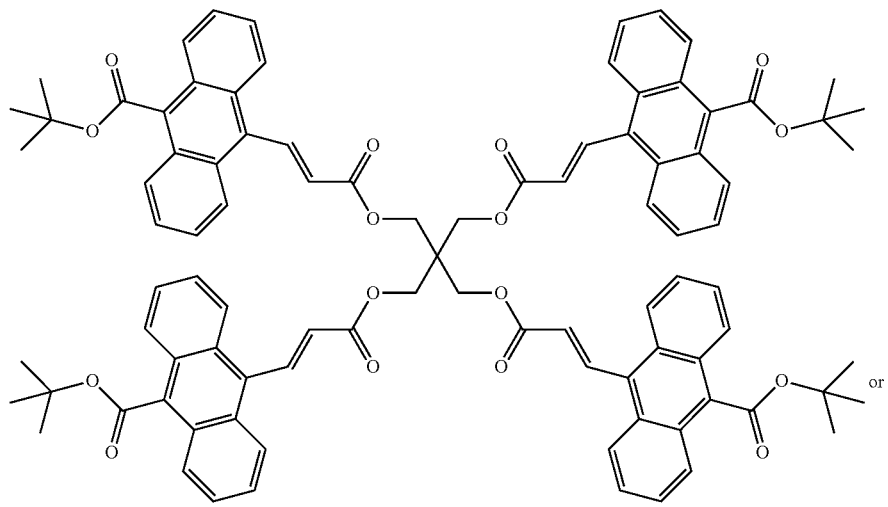

-continued
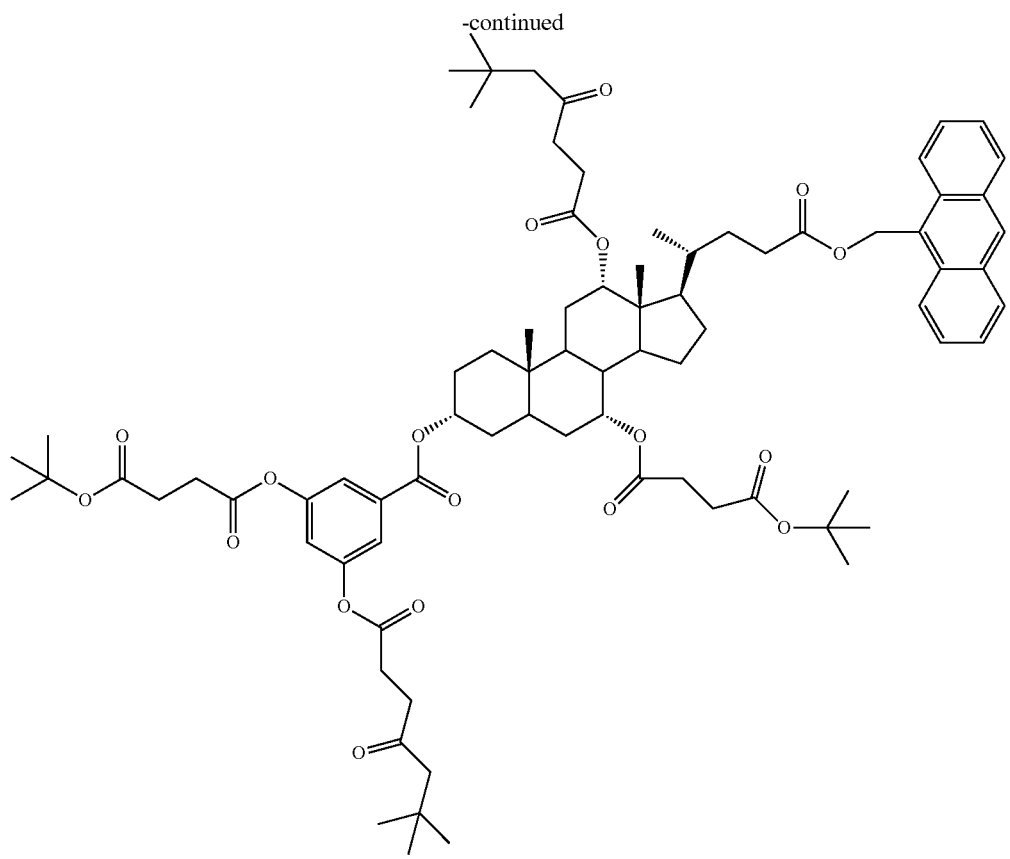
9. A process for the production of a compound of formula II as claimed in claim 1 comprising reacting
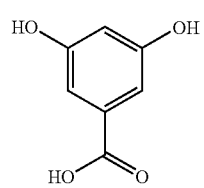
with one or more groups A, or $R^2CO_2H$.
10. The process as claimed in claim 9 wherein the compound of formula II has the formula
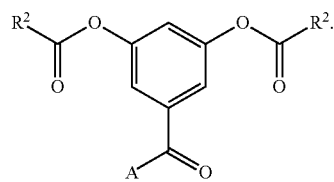
11. The process as claimed in claim 9 wherein $R^2CO_2H$ is one or more selected from
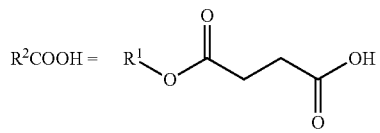
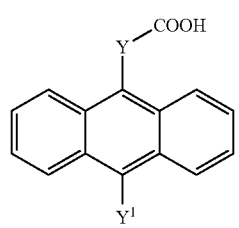
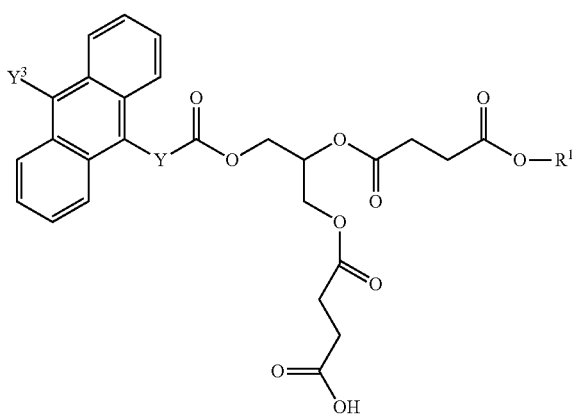

-continued

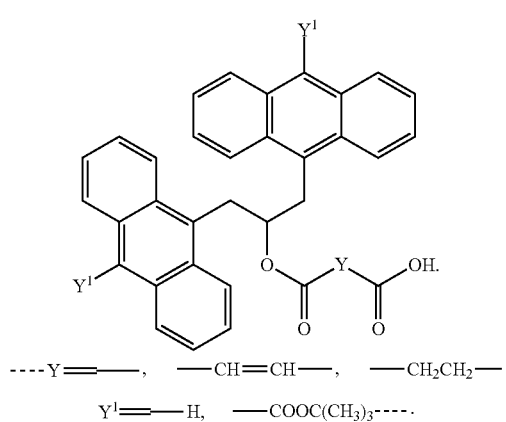

----Y≡———,   —CH═CH—,   —CH₂CH₂—
Y¹≡——H,   —COOC(CH₃)₃----

12. A process for the production of a compound of formula II as claimed in claim 1 comprising reacting

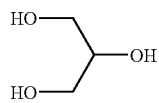

with one or more —X-A and/or —X—B groups.

13. A process as claimed in claim 12 wherein the —X-A and/or —X—B groups have the formula

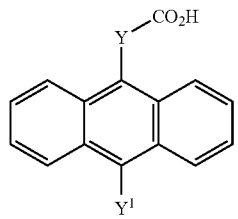

wherein Y is -, —CH═CH—, or —CH₂CH₂— and Y¹ is —H, or —COOC(CH₃)₃.

14. A process as claimed in claim 12 wherein the compound of formula II is

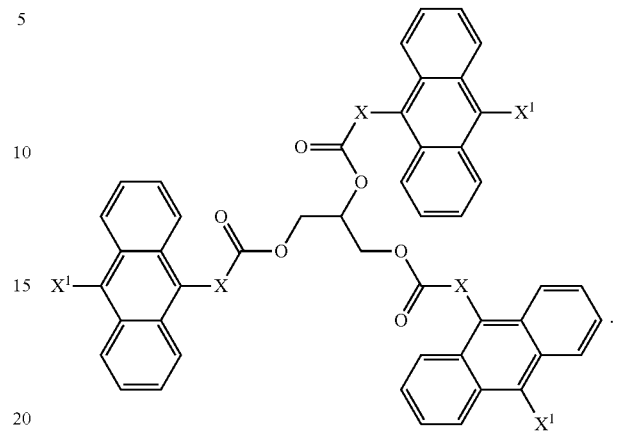

15. A process for the production of a compound of formula II as claimed in claim 1 comprising reacting

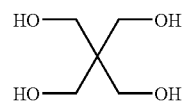

with one or more groups $R^2$—CO$_2$H, —X-A and/or —X—B.

16. The molecular photoresists according to claim 1, wherein B is selected from the group consisting of tert-butyl, tetrahydropyranyl, trialkyl-silyl, adamantly.

* * * * *